United States Patent [19]

Umeda et al.

[11] Patent Number: 5,708,352
[45] Date of Patent: Jan. 13, 1998

[54] A.C. GENERATOR FOR VEHICLES

[75] Inventors: Atsushi Umeda; Masatoshi Togawa, both of Anjo; Junji Kawai, Kariya; Hirohide Sato, Toyokawa; Norihito Tokura, Okazaki, all of Japan

[73] Assignee: Nippondenso Co., Ltd., Kariya, Japan

[21] Appl. No.: 756,514

[22] Filed: Nov. 26, 1996

Related U.S. Application Data

[63] Continuation of Ser. No. 351,007, Dec. 7, 1994, abandoned.

[30] Foreign Application Priority Data

Dec. 7, 1993 [JP] Japan .................................. 5-306755
Dec. 10, 1993 [JP] Japan .................................. 5-310577

[51] Int. Cl.$^6$ .................................................. H02H 7/06
[52] U.S. Cl. ............................................ 322/28; 363/17
[58] Field of Search ........................... 363/17, 19, 132; 322/20, 28, 46, 50, 59, 99, DIG. 2

[56] References Cited

U.S. PATENT DOCUMENTS

| | | | |
|---|---|---|---|
| 4,415,848 | 11/1983 | Morishita | 322/32 |
| 4,636,705 | 1/1987 | Bowman | 322/28 |
| 4,665,354 | 5/1987 | Sada et al. | 320/64 |
| 5,140,253 | 8/1992 | Itoh | 322/28 |
| 5,170,231 | 12/1992 | Fujii et al. | 357/23.2 |
| 5,233,215 | 8/1993 | Baliga | 257/490 |
| 5,323,040 | 6/1994 | Baliga | 257/332 |
| 5,389,799 | 2/1995 | Uemoto | 257/77 |
| 5,399,515 | 3/1995 | David et al. | 437/40 |
| 5,449,962 | 9/1995 | Schichiyo et al. | 310/184 |

FOREIGN PATENT DOCUMENTS

| | | |
|---|---|---|
| 656661 | 6/1995 | European Pat. Off. . |
| 2512406 | 3/1983 | France . |
| 63-202255 | 8/1988 | Japan . |
| 63-277433 | 11/1988 | Japan . |
| 64-12827 | 1/1989 | Japan . |
| 4-138030 | 5/1992 | Japan . |
| 4-239778 | 8/1992 | Japan . |
| 7-131016 | 5/1995 | Japan . |

OTHER PUBLICATIONS

J.W. Palmour, "6H Silicon Carbide Power Devices for Aerospace Applications"; Proceeding of the 28th Intersociety Energy Conversion Engineering Conference, vol. 1, 8 Aug. 1993, pp. 1249–1254.

Patent Abstract of Japan, vol. 16, No. 412 (E1256), Aug. 1992 re JP-A 4138030.

Patent Abstract of Japan, vol. 17 No. 110 (E1329), Mar. 1993 re JP-A 4295236.

Patent Abstract of Japan, vol. 7 No. 267 (E–213) (1412) Nov. 1983 JP–A 58148640.

Patent Abstract of Japan, vol. 17 No. 453 (E–1417) Aug. 1993, re JP–A 5102497.

Patenta Abstract of Japan, vol. 10, No. 197 (E–418((2253) Jul. 19986 re JP–A 61039837.

(List continued on next page.)

Primary Examiner—Matthew V. Nguyen
Attorney, Agent, or Firm—Cushman, Darby & Cushman IP Group of Pillsbury, Madison & Sutro LLP

[57] ABSTRACT

An alternating current generator for motor vehicles having an extremely small power loss and which can be simply cooled includes a power converter having at least either high side semiconductor power elements or low side semiconductor elements. The high side power elements connect an output terminal of the armature coil to a high potential terminal of the battery; the low side semiconductor power elements connect an output terminal of the armature coil to a low potential terminal of the battery. The power converter converts the alternating current generated voltage of the armature coil into a direct current voltage to supply electricity to the battery. An exciting current controller includes a switching transistor for controlling an exciting current to a field coil. The semiconductor power elements in the power converter and/or the switching transistor in the exciting current controller are/is formed of SiC material, which is a compound of Si and C, having a resistivity smaller than that of pure Si.

21 Claims, 23 Drawing Sheets

OTHER PUBLICATIONS

The relation between the present invention and the prior art "SiC and Relating Wide Gap Semiconductor Research, The Third Meeting Draft", 10/1994.

Akira Suzuki et al, "Thermal Oxidation of SiC and Electrical Properties of . . . Structure", Japanese Journ. of Applied Physics vol. 21 No. 4 April 1982 pp. 579–585.

Tsunenobu Kimoto et al, "Two-dimensional nucleation and step dynamics in crystal growth of SiC", Inst. Phys. Conf. Ser No. 137 Chapter 1, Nov. 1993, pp. 55–58.

Electronic Components and Circuits "Power MOSFETs Formed in Silicon Carbide" Nasa Tech Briefs, Feb. 1995.

John W Palmour et al, "6H–Silicon Carbide Power Devices for Aerospace Applications", Intersociety Energy Conversion Engineering Conference, Aug. 1993, pp. 1.249–1.254.

Patent Abstract Of Japan, vol. 16, No. 412 (E–1256), 31 Aug. 1992 Re: JP 04138030 A (Honda Motor Co. Ltd.), 12 May 1992.

J.W. Palmour, "6H–Silicon Carbide power devices for Aerospace Applications", Proceedings Of The 28th Intersociety Energy Conversion Engineering Conference, vol. 1, 8 Aug. 1993, p. 1249, col. 1, paragraph 3; figure 3.

Patent Abstracts Of Japan, vol. 17, No. 110 (E–1329), 8 Mar. 1993 Re: JP 04295236 A (Nippondenso Co. Ltd.), 20 Oct. 1992.

Patent Abstracts Of Japan, vol. 10, No. 197 (E–418) [2253], 10 Jul. 1986 Re: JP 61039837 A (Hitachi Ltd.), 26 Feb. 1986.

Patent Abstracts Of Japan, vol. 7, No. 267 (E–213) [1412], 29 Nov. 1983, Re: JP 58148640 A (Hitachi Seisakusho K.K.), 3 Sep. 1983.

Patent Abstracts Of Japan, vol. 17, No. 453 (E–1417), 19 Aug. 1993, Re: JP 05102497 A (Toshiba Corp.), 23 Apr. 1993.

REVOLUTION NUMBER OF ALTERNATOR [rpm]

A.C. GENERATOR FOR VEHICLES

This is a continuation of application Ser. No. 08/351,007, filed on Dec. 7, 1994 now abandoned.

CROSS REFERENCE TO RELATED APPLICATION

This application is based upon and claims the benefit of priority of the Japanese Patent Applications 5-306755 filed on Dec. 7, 1993 and 5-310577 filed on Dec. 10, 1993, the contents of which are incorporated herein by reference.

BACKGROUND OF THE INVENTION

1. Field of the Invention

The present invention relates to an alternating current (A.C.) generator for motor vehicles, the generator providing a power converter for converting an alternating current generated voltage into a direct current voltage and an exciting current controller for controlling an exciting coil. More particularly, the A. C. generator for motor vehicles according to the present invention can be applied to so-called alternators driven by an engine, alternators for regenerating kinetic energy generated at the time of braking vehicles as an electric power to enable the generation of power, and vehicle-driving motors for electric automobiles.

2. Related Art

A. C. generators are already known which include a three-phase full wave rectifier having high side semiconductor elements for individually connecting each end of a three-phase armature winding (coil) to a high potential end of a battery and a low potential end thereof, and a low side three-phase full wave rectifier having semiconductor power elements, and a controller for synchronously interrupting each of the aforementioned semiconductor power elements. The three-phase full wave rectifier converts a generated voltage of the three-phase armature winding into a direct current to supply electricity to the battery. For example, Japanese Unexamined Patent Application No. Hei 4-138030 discloses use of MOS power transistors as the aforementioned semiconductor power elements.

MOS power transistors of this kind normally adopt a vertical-type transistor structure in which an N-type silicon (Si) substrate constitutes a main electrode on one side of the MOS transistor to secure a withstand voltage and a reduction in resistance, and $N^+$-type region constitutes the other main electrode thereof, the $N^+$-type region being formed on a surface portion of a P-type well region formed on the surface of a chip.

On the other hand, an output current of the A. C. generators for motor vehicles is controlled by connecting in series an exciting coil and a switching transistor between both output terminals of the three-phase full wave rectifier and interrupting an exciting current passing through the exciting coil with a switching transistor of an exciting current controller. This exciting current controller is normally arranged either inside or outside of a housing of the A. C. generators for the shrinkage of wirings and a reduction in the generation of the electromagnetic noises.

As the switching transistor, transistors formed of silicon, either bipolar transistors (hereinafter referred to as Si-BPT's) or MOS power transistors (hereinafter referred to as Si-MOST's), are used.

Since the three-phase full wave rectifier using the aforementioned MOS power transistors has a construction wherein a parasitic diode serving as a PN-junction diode of the conventional three-phase full wave rectifier and a MOS power transistor are connected in parallel, a power loss might be reduced by the absence of a voltage drop in the forward direction of the junction diode as compared with the three-phase full wave rectifier using a conventional silicon diode.

However, the inventors of the present invention have clarified in their analysis that the aforementioned three-phase full wave rectifier of the MOS power transistor type suffers from the following drawback.

In the A. C. generator for motor vehicles, the accumulated amount of magnetic energy is so large in the winding of the three-phase armature and the exciting coil that the withstand voltage of each of the semiconductor power elements in the three-phase full wave rectifier needs to be set to about 300 volts, 20 times or more that of the battery voltage, or the output rectifying voltage of the three-phase full wave rectifier.

Furthermore, an increase in the vehicle-carried electric load in recent years (for example, for defrosting heater or the like) demands an output current of 100 A or more. Since the power loss in the MOS power transistor with such a high withstand voltage and a large current construction has become almost equal to the counterpart of diodes, use of MOS power transistors with such complicated construction in place of diodes has become insignificant.

Problems in the aforementioned three-phase full wave rectifier of the MOS transistor type will be analyzed 3in more detail hereinafter in conjunction with FIGS. 3(a), 3(b), 4 and 5. FIGS. 3(a) and 3(b) are views of an inverter circuit, the views showing one-phase portion of the three-phase full wave rectifier of the MOS power transistor type, FIG. 3(a) showing a case of a N-type channel MOS power transistor, FIG. 3(b) showing a case of P-type channel MOS power transistor. Furthermore, FIGS. 4 and 5 are views showing a typical example of cross section structure of a typical MOS power transistor.

In the inverter circuit of the N-channel MOS power transistor shown in FIG. 3(a), a drain electrode D of a high side MOS power transistor 101 and a source electrode S of a low side MOS power transistor 102 are connected to one phase output terminal, a drain electrode D of a low side MOS power transistor 102 is connected to a low potential terminal of a battery (not shown), and a source electrode S of a high side MOS power transistor 101 is connected to a high potential terminal of the battery. The direction of the charging current at the charging time is opposite to the travel direction of electrons.

In addition, in the aforementioned MOS power transistors 101 and 102, a source-side connected parasitic diode Ds and a drain-side connected parasitic diode Ds are generated in principle between the P-type well region and either the source electrode S or the drain electrode D as shown in FIGS. 3(a) and 3(b).

The P-type well region is normally connected either to the source electrode S or to the drain electrode D out of the necessity of adding a potential to the P-type well region. When this inverter circuit is used as one-phase circuit of the three-phase full wave rectifier, the drain connected parasitic diode Dd which connects the P-type well region (for example, at 103 in FIGS. 4 and 5) to the drain electrode D (for example, at 104 in FIGS. 4 and 5) needs to be short-circuited as shown in FIG. 3(a).

In other words, when the P-type well region (for example, at 103 in FIGS. 4 and 5) is connected to the source electrode S (for example, at 106 in FIGS. 4 and 5) and the source connected parasitic diode Ds is short-circuited in the three-phase full wave rectifiers for motor vehicles, a drop in the generated voltage connected to the drain electrode D of the high side MOS power transistor to a voltage lower than the battery voltage causes a reverse current to flow through the drain connected parasitic diode Dd. In the same manner with a rise in the generated voltage connected to the source electrode S of the low side MOS power transistor to a voltage exceeding the lower potential voltage (grounded voltage) causes a reverse current to flow through the drain connected parasitic diode Dd. Therefore, the prevention of the reverse current flowing through the drain connected parasitic diode Dd requires the connection of the P-type well region 103 to the drain electrode so as to prevent the flow of the reverse current with the source connected parasitic diode Ds.

In conclusion, the P-type well region (for example, at 103 in FIGS. 4 and 5) of the MOS power transistor used in the three-phase full wave rectifier in A. C. generators for motor vehicles needs to be connected to the drain electrode D. The same thing holds true of the P-channel MOS power transistor shown in FIG. 3(b).

However, in the conventional MOS power transistor structure shown in FIGS. 4 and 5, the P-type well region 103 and the N$^+$-type region 104 located on the surface portion of the P-type well region 103 are inevitably short-circuited, and a depletion layer 107 located between the P-type well region 103 and the N-type epitaxial withstand voltage layer 105 is inevitably swelled to the N-type epitaxial withstand voltage layer 105 to endure the withstand voltage.

In other words, when the three-phase full wave rectifier in the aforementioned A. C. generator for motor vehicles is constituted of the conventional MOS power transistor construction shown in FIGS. 4 and 5, an N$^+$-type substrate 106 inevitably serves as a source region whereas the N$^+$-type region 104 inevitably serves as a drain region. However, in such a construction, a large source parasitic resistance Rs in the N-type withstand voltage layer 105 is connected in series to a substantial source terminal S' and the source electrode.

A drain saturated current Idsat in the MOS transistor is ignored for the simplification of a threshold voltage Vt. The drain saturated current Idsat is represented by the following equation;

$$Idsat=K(Vg-Vs')^2=K(\Delta Vgs-Idsat \cdot Rs)^2$$

where K is a proportional constant, $\Delta$Vgs is a voltage between gate and source (Vg–Vs), and Vs'=Vs+Idsat·Rs and represents a potential of a substantial source terminal S'.

In other words, the drain saturated current (maximum current at the time of the application of a predetermined gate voltage) Idsat is equal to a drop in the gate voltage Vg by Idsat·Rs. Incidentally, a change in the threshold voltage resulting from the substrate effect is also ignored.

For example, when the gate voltage assumes +20 volts, a source (battery) voltage +12 volts, current 100 A, and a source parasitic resistance Rs 0.05 ohms, the actual source potential Vs' becomes 17 volts with the result that a channel current drops to 9/64 of a case where Rs is 0. In other words, the fact shows that a slight rise in the source parasitic resistance Rs extremely reduces the channel current. This current reduction effect, or the channel resistance rise effect is referred to as the source resistance feedback effect.

The aforementioned equation is applied to a drain current saturated region. In the same manner, a rise in the source parasitic resistance Rs reduces a drain unsaturated current in the unsaturated region. Such a reduction in the drain current means a rise in a channel resistance. A rise in the aforementioned source parasitic resistance Rs itself invites a loss of power, as well as a rise in the channel resistance resulting in a loss of power. This shows that the aforementioned phenomenon invites a large loss of power and heating.

Of course, it is possible to reduce a thickness of the N-type withstand voltage layer 105 for the reduction in the source parasitic resistance Rs in the MOS power transistor construction shown in FIGS. 4 and 5. However, since A. C. generators for motor vehicles require a high withstand voltage such as 300 volts as described above, it is difficult to reduce the thickness of the N-type withstand voltage layer 105.

In other words, when the breakdown electric field strength of silicon is about 30 volts/µm in normal MOS power transistors, the N-type withstand voltage layer 105 requires a thickness of 10 µm even with a constant electric field strength in the N-type withstand voltage layer 105 assuming that only the N-type withstand voltage layer 105 endures the withstand voltage of 300 volts. In actuality, the thickness of the N-type withstand voltage layer 105 must be set to about 20 µm or more so that the N-type withstand voltage layer 105 endures 300 volts with the electric field strength in the N-type withstand voltage layer 105 being set to about 30 volts/µm. The impurity concentration must be set to about $1 \times 10^{15}$ atoms/cm$^3$ or less.

Formation of the N-type withstand voltage layer 105 having such a thickness and an impurity concentration for securing the withstand voltage invites a rise in the aforementioned source parasitic resistance Rs and a resistance loss as well as the aforementioned reduction in the drain current (a large increase in the channel resistance). Consequently, the three-phase full wave rectifier of the MOS power transistor described in the aforementioned Japanese Unexamined Patent Application No. Hei 4-138030 cannot exceed the three-phase full wave rectifier of the PN-junction diode type in theory in the usage of A. C. generators for motor vehicles (namely, reactance load field). Therefore, the three-phase full wave rectifier of the MOS power transistor type has no merit in practical usage with such defects as complicated structure and control.

On the other hand, it is possible to consider that the N$^+$-type region 104 serves as the source electrode and N$^+$-type substrate 106 serves as the drain electrode in the MOS power transistor construction shown in the aforementioned FIGS. 4 and 5 to short-circuit the P-type well region 103 and the N$^+$-type drain region 106.

However, it is extremely difficult in this method to secure a withstand voltage of 300 volts between the N$^+$-type region (source region) 104 and the P-type well region 103 while securing the withstand voltage between the gate electrode and the P-type well region 107, and the N$^+$-type region 104.

The inventors of the present invention have concluded for the aforementioned reasons that an actual improvement of the breakdown electric field strength in the withstand voltage layer will result in a remarkable power loss and heating in the power converter in the A. C. generators for motor vehicles based on the results of their analysis. The MOS power transistor used in a power converter for converting an alternating current generated voltage into a direct current voltage can hardly be formed with the currently available silicon MOS power transistor. The realization of the power converter of the MOS power transistor requires a remarkable reduction in the resistance in the withstand voltage layer, a remarkable reduction in the thickness of the withstand voltage layer, and an increase in the impurity concentration, all of which can be realized only after the breakdown electric field strength in the withstand voltage layer is remarkably improved.

In the foregoing passage, relations between an output current of A. C. generators for motor vehicles and properties of a switching transistor in the aforementioned exciting current controller will be analyzed hereinafter.

A rise in a maximum temperature permitted for the MOS power transistors (MOST's) or bipolar power transistors (BPT's) as the switching transistor is limited (for example, tens of degrees in terms of the surface temperature). A rise in the permissible temperature $\Delta T$ limits the maximum permissible heating quantity Qmax of the switching transistor. The maximum permissible heating quantity is represented by an equation; $Qmax = r \times Imax^2 = f(rt, S, \Delta T)$ where r is an ON resistance r of the switching transistor, Imax a maximum excited coil, f a function, rt a heat radiation resistance, and S a heat radiation area.

An ON resistance r in the conventional transistor which constitutes the switching transistor for controlling the exciting current in the A. C. generators for motor vehicles has a definite minimum value.

In other words, since the aforementioned A. C. generators for motor vehicles have a large accumulated magnetic energy amount in the three-phase armature winding and the exciting coil, an extremely high surge voltage is applied to the switching transistor through a high output potential terminal of the three-phase full wave rectifier in accidents (such as coming off of the battery terminal and the generation of a load damp voltage) in which the accumulated magnetic energy is discharged in a moment. Therefore, the switching transistor needs to be designed with specifications of a high withstand voltage (300 volts or more even in A. C. generators for motor vehicles with a rated voltage of 14 volts).

However, the conventional transistors formed of silicon such as Si-BPT's and Si-MOST's have a definite avalanche breakdown electric field strength, enduring a withstand voltage within the scope where transistors do not break down inevitably requires an increase in the thickness of the withstand voltage layer and a low impurity concentration. Consequently, the resistivity of the switching transistor could not be reduced to a definite value or less. Incidentally, an increase in a chip size is effective to reduce the ON resistance r. However, it is difficult to increase the chip size to a certain limit (for example 10 mm square) or more because of a reduced yield. Therefore, the ON resistance r of the conventional switching transistor is limited to a certain value or more because of a large resistivity of the withstand voltage layer and a limited chip area.

That is, A. C. generators for motor vehicles generate a high surge voltage along with the discharge of magnetic energy with the result that the switching transistor has a high ON resistance r. Hence it is apparent that the maximum exciting current Imax inevitably requires to be set at a relatively small value to reduce a heating amount of the switching transistor to less than a definite maximum permissible heating amount Qmax.

It is appreciated that since the maximum flux quantity $\Phi$max of A. C. generators for motor vehicles stands virtually proportional to the maximum exciting current Imax and the output power of A. C. generators for motor vehicles depends on the maximum flux quantity $\Phi$max, a high withstand voltage performance required of the switching transistors used in A. C. generators for motor vehicles strongly limits an improvement in the output of A. C. generators for motor vehicles in the end.

Naturally, it is possible to use a plurality of switching transistors in parallel to increase the maximum permissible heating amount Qmax, or maximum exciting current Imax. However, using a plurality of switching transistors in parallel causes a problem of element cost and required space.

It is also thought that the maximum exciting current Imax is increased by an improvement in the radiating properties of switching transistors. Since switching transistors are arranged on the end surface of a housing of A. C. generators for motor vehicles, it is difficult to arrange a large radiating fin because it will result in an increase in the size of A. C. generators and an increase in ventilation resistance.

Furthermore, since the aforementioned switching transistors are arranged on the end surface of the housing of A. C. generators, the transistors are affected by heating inside the generators and heat radiated from engines through the housing. On the other hand, since cooling air has a low wind flow amount when the engine is idle, the peripheral temperature of the switching transistors becomes considerably high (for example, 135° C.) when the engine is idle, the outside temperature is high, and an electric load is large. This strictly limits the aforementioned permissible temperature rise $\Delta T$ permitted for the switching transistors in this respect, thereby further limiting the maximum permissible heating amount Qmax and the maximum exciting current Imax and finally the output current of A. C. generators for motor vehicles.

The present invention has been made on the basis of the result of a detailed analysis of the aforementioned prior art.

SUMMARY OF THE INVENTION

Therefore, an object of the present invention is to provide an A. C. generator which can improve an output efficiency and which can facilitate cooling with less heating.

Another object of the present invention is to provide an A. C. generator for motor vehicles which has a power converter whereby the generator can remarkably reduce a power loss compared with the conventional three-phase full wave rectifier and can facilitate the cooling.

Still another object of the present invention is to provide an A. C. generator for motor vehicles which is capable of largely improving an output without damaging the reliability because of a reduced operational margin of switching transistors and without damaging the cooling of coils because of an increase in the ventilation resistance of the generator, based on a finding that properties of the aforementioned switching transistor for exciting current control limits an improvement in the output of generators.

Still another object of the present invention is to provide an A. C. generator for motor vehicles which is capable of reducing the ventilation resistance thereof, reducing a space in which the switching transistors are arranged and improving the economy thereof by reducing the size of and simplifying the switching transistors for exciting current control and cooling construction thereof without inviting a reduction in the output of the generator.

Still another object of the present invention is to provide an A. C. generator for motor vehicles which is capable of largely reducing a resistance power loss in a withstand voltage layer, or a source parasitic resistance Rs of MOS power transistors in a power converter and which generator is capable of largely reducing a channel resistance as a result of a reduction in the feedback effect of the source resistance whereby the power loss can be remarkably reduced with the synergistic effect of the reduction in the resistance power loss and the reduction in the channel resistance as compared with a three-phase full wave rectifier in A. C. generators using Si MOS power transistors and a three-phase full wave rectifier of the diode type having the same amount of power loss as the A. C. generator using Si MOS power transistors, and the cooling of the generator can be extremely simplified.

To achieve the aforementioned objects, the present invention provides an A. C. generator for motor vehicles including a power converter for converting an alternating current generated voltage in an armature coil into a direct current voltage to supply electricity to a battery, and an exciting current controller having a switching transistor for controlling an exciting current to an exciting coil. Semiconductor power elements in at least one of the power converter and the switching transistor in the exciting current controller is formed of SiC.

The aforementioned semiconductor power elements are constituted as MOS power transistors. In addition, the generator has a three-phase armature coil, and at least either high side MOS power transistors or low side MOS power transistors, the high side MOS power transister connecting each terminal of the three-phase armature coil in parallel to a high potential terminal of the battery, the low side MOS power transistors connecting each terminal of the three-phase armature coil in parallel to a low potential terminal of the battery, the MOS power transistors being formed of the aforementioned SiC.

BRIEF DESCRIPTION OF THE DRAWINGS

These and other objects, features, and characteristics of the present invention will become clear to a person of ordinary skill in the art from a study of the following detailed description, the appended claims and drawings, in which.

DESCRIPTION OF THE PREFERRED EMBODIMENTS

As described above, since A. C. generators for motor vehicles have a large accumulated magnetic energy amount in an armature winding and a field coil, it is necessary to set a withstand voltage of each of the semiconductor power elements in the rectifier to, for example, about 300 volts, which is more than 20 times the output rectifying voltage in the rectifier.

In addition, a large output current of 100 A or more is demanded as a result of an increase in the electric load carried on vehicles.

Here, a breakdown electric field strength of SiC is about 400 volts/μm, which is about 13 times that of Si. The fact that SiC has much larger breakdown electric field than Si means that use of SiC as a constituent element of the rectifier in A. C. generators for motor vehicles has an advantage of remarkably reducing a power loss in MOS power transistors. The advantage of reduction in the power loss resulting from a difference in the aforementioned breakdown electric field strength will be explained further in detail hereinafter.

Figure 4:
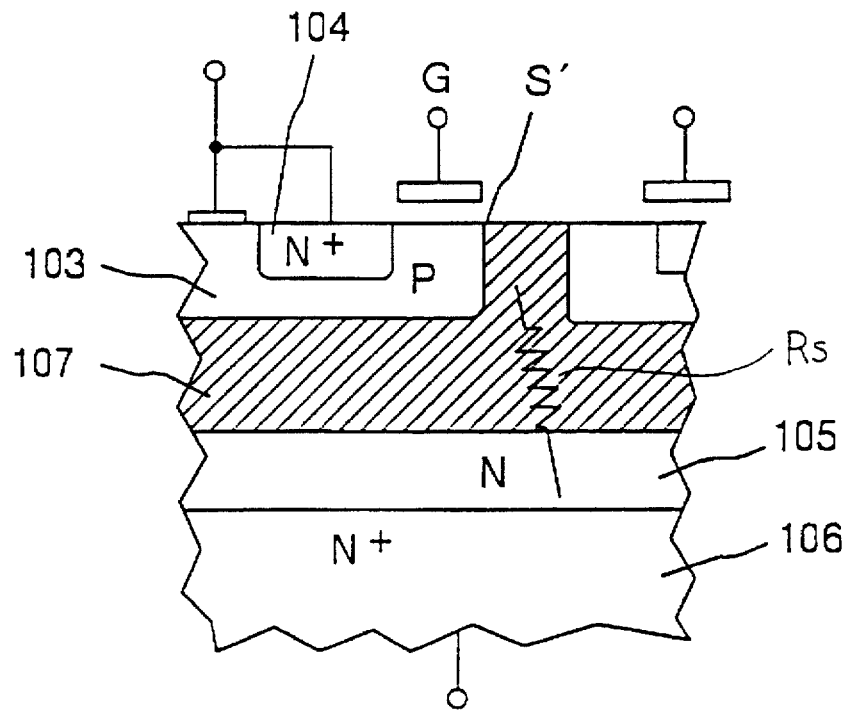
FIG. 4 is a partially enlarged sectional view showing one example of an MOS power transistor structure constituting a three-phase full wave rectifier.

As an example, consideration is given to a case where SiC MOS power transistors are used in the three-phase full wave rectifier of the A. C. generator for motor vehicles to secure a withstand voltage of 300 volts. For simplicity, it is thought that the N-type withstand voltage layer 107 (for example, shown in FIGS. 4 or 5, where the structure is the same in the present invention as was previously known. However, the present invention achieves superior results by using SiC rather than pure Si and contributes completely to the withstand voltage of 300 volts.

When it is simply thought that the N-type withstand voltage layer 107 endures the withstand voltage of 300 volts, the required thickness of the N-type withstand voltage layer 105 is about 4 µm, the impurity concentration is $2\times10^{16}$ atoms/cm$^3$, and the resistivity is about 1.25 Ωcm with the breakdown electric field strength of SiC being set to 400 volts/µm. On the other hand, the required thickness of the N 300 volt withstand voltage layer in the Si MOS power transistor described above is about 20 µm, the impurity concentration is $1\times10^{15}$ atoms/cm$^3$ and the resistivity is about 5 Ωcm. Consequently, this means that the resistance of the N-type withstand voltage layer 107 in the SiC MOS power transistor can be reduced to 1/20 that of the N-type withstand voltage layer 107 in the Si MOS power transistor. However, it is quite natural that the impurity concentration in the N-type withstand voltage layer 107 can be lower than the aforementioned value in relation with the impurity concentration in the P-type well region 103.

On the other hand, the resistance of the withstand voltage layer in the SiC MOS power transistor can be reduced to 1/10 that of the Si-BPT and the Si-MOST to realize the withstand voltage(for example, 300 volts or more) required of a switching transistor for exciting current control.

That is, the Si MOS power transistor has a breakdown electric field strength of about 30 volts/µm. When it is simply considered that the N-type withstand voltage layer 105 endures the withstand voltage of 300 volts, the required thickness of the withstand voltage layer is about 20 µm, the impurity concentration is $1\times10^{15}$ atoms/cm$^3$, and the resistivity is about 5 Ωcm.

Additionally, since the breakdown electric field strength of SiC is 400 volts/µm as described above, the required thickness of the N-type withstand voltage layer 105 is about 4 µm, the impurity concentration is $2\times10^{16}$ atoms/cm$^3$, and the resistivity is about 1.25 Ωcm. Consequently, the resistance of the N-type withstand voltage layer 105 in the SiC MOS power transistor as the switching transistor can be reduced to about 1/20 that of the N-type withstand voltage layer 105 in the Si MOS power transistor.

Furthermore, even though other resistance components are added to the resistance of the N-type resistant layer 105 in the calculation, an ON resistance r of the SiC-MOST will be about 1/25 that of the Si-MOST, and about 1/19 that of the Si-BPT when the ON resistances r of Si-BPT, Si-MOST, and SiC-MOST are calculated with the design rules and the chip area being the same.

As described above, the permissible temperature rise ΔT permissible from the surrounding environment regulates the maximum permissible heating quantity Qmax, which can be represented by the following expression; $Qmax = r \times Imax^2$ where r is an ON resistance r of the switching transistor and Imax is the maximum exciting current. The fact that the ON resistance r can be reduced as described above means that the maximum exciting current can be increased by about 4 to 4.5 times (namely, $1/(r^{0.5})$) with one chip when the maximum permissible heating quantity Qmax is definite. This means that the maximum flux amount Φmax controllable with one switching transistor, and even the output of A. C. generators for vehicles can be remarkably increased. Naturally, such an increase in the maximum flux amount Φmax requires an enlargement of the field coil and a field iron core. The fact that such a large amount of field flux can be controlled with one switching transistor is an important advantage.

It goes without saying that the ON resistance can be reduced to 1/25 and the same operation can be realized when 25 Si-MOST's are connected in parallel. However, it is difficult to arrange such a large number of Si-MOST's or Si-BPT's on the end surface of a housing of the generator. Even if it is possible to arrange such transistors thereon, the inside of the generator can hardly be cooled by ventilation because the cooling air is absorbed inside from the end surface of the housing. Thus, it is impossible to use such an arrangement on a practical level.

Therefore, as seen in the present invention, the output of the A. C. generator for motor vehicles can be remarkably increased with the adoption of a SiC-MOST as the switching transistor.

On the other hand, when the output of the A. C. generators for motor vehicles is set to the same level as the conventional counterpart assuming that the maximum exciting current Imax remains the same, the ON resistance r of the switching transistor can be reduced to about 5% of that of a conventional switching transistor. Thus, the heating can be reduced by about 95%, with the result that a rise in temperature of the element can be largely reduced, and a cooling system such as cooling fin will be simplified.

Further, since the required space is largely reduced, the cooling performance can be improved with a larger opening of a cooling air inlet on the end surface of the housing.

Additionally, assuming that the heating amount of the switching transistor is the same as the conventional counterpart, the chip area can be reduced to about 1/20 thereby largely improving the yield of chips and integrating other circuits.

Incidentally, in the aforementioned description, the SiC-MOS power transistor is used as the switching transistor. However, it goes without saying that the same advantage can be produced by using as the switching transistor other power elements such as a SiC bipolar transistor and MOS-SIT in place of the SiC-MOS power transistor.

Embodiment 1

Figure 2:
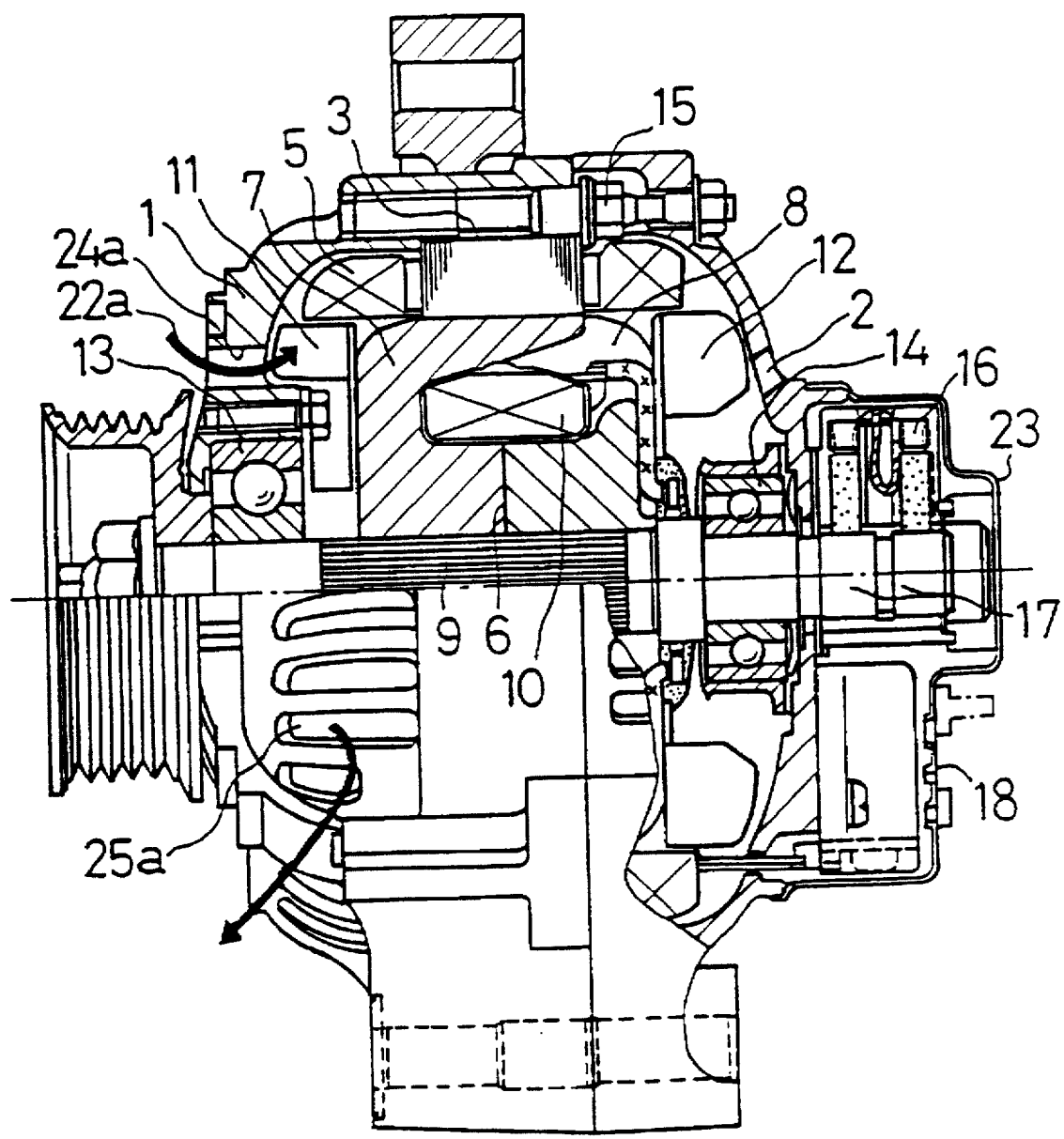
FIG. 2 is a sectional view of the A. C. generator for motor vehicles of FIG. 1.

Referring to FIG. 2, there is illustrated an overall construction of an engine-driven A. C. generator for motor vehicles, or a so-called alternator according to embodiment 1 of the present invention.

A hull of the generator comprises a drive frame 1 and a rear frame 2 which are directly connected with a plurality of stud bolts 15 or the like.

A stator core 3 is fixed to an internal circumference of the frames 1 and 2. A three-phase generator winding 5 is wound around the stator core 3. A shaft 9 is rotatably supported by bearings 13 and 14 fixed to the frames 1 and 2. A rotor core 6 is located on the internal circumference of the stator core 3 and fixed to the shaft 9. A field winding 10 is wound around the rotor core 6. On both end surface of the pole cores 7 and 8, cooling fans 11 and 12 are arranged. In addition, a three-phase full wave rectifier 19 incorporating voltage regulator 18 is provided outside of rear frame 2. In FIG. 2, numeral 16 is a brush, 17 is a slip ring, and 23 is a rear cover. Further, numeral 22a denotes cooling air introduced from an inlet 24a to an outlet 25a.

Figure 1:
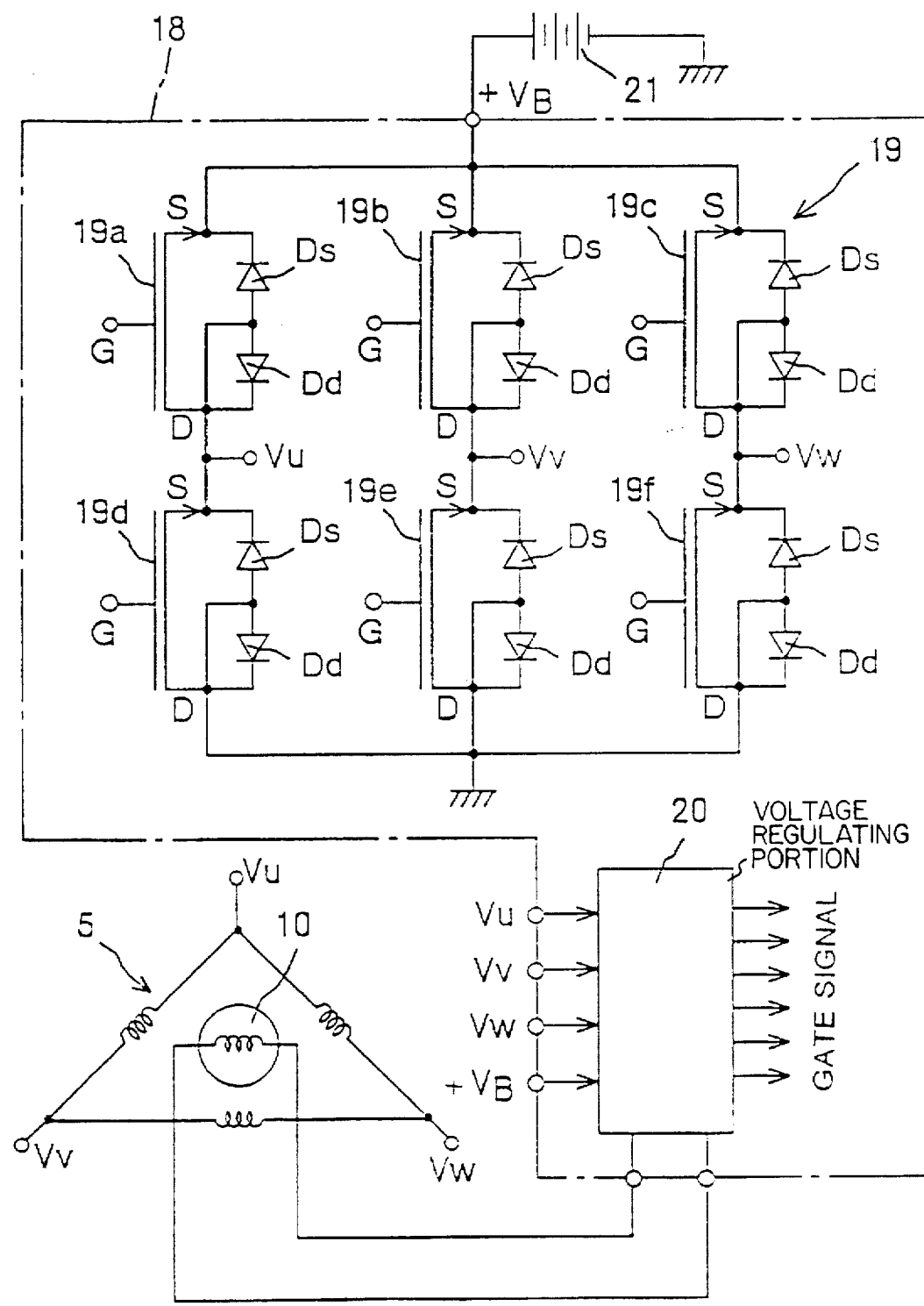
FIG. 1 is a circuit diagram of an A. C. generator for motor vehicles according to the first embodiment.

A circuit configuration of the A. C. generator for motor vehicles according to embodiment 1 will be explained in conjunction with FIG. 1.

The voltage regulator 18 comprises the three-phase full wave rectifier 19 and a voltage regulating portion 20. The rectifier 19 is a three-phase full wave rectifier comprising MOS power transistors 19a through 19f of the N-channel enhancement type formed on a single crystal SiC. In such a rectifier, the high side transistors 19a through 19c connect each phase output terminal of the three-phase generator winding 5 to a high potential terminal of the battery 21 whereas the low side transistors 19d through 19f connect each phase output terminal of the three-phase generator winding 5 to a low potential terminal of the battery 21.

The voltage regulating portion 20 is connected to the field winding 10 via a brush 16 and a slip ring 17, and is mounted on the same substrate (not shown) as the three-phase full wave rectifier 19. Mounting such three-phase full wave rectifier 19 and the voltage regulating portion 20 on the same substrate enables the shrinkage of the length of the wirings. Furthermore, each phase generated voltage is entered to each phase output terminal of the three-phase generator winding 5. A gate voltage applied to each gate electrode of the MOS power transistors 19a through 19f is controlled based on these input signals.

The voltage control behavior is explained as follows. In an engine (not shown), a voltage regulating portion 20 of the voltage regulator 18 reads a voltage VB of the battery 21. When the opening and closing of the field winding 10 is controlled so that the voltage of the battery 21 assumes a definite value, a three-phase alternating current voltage is excited in the three-phase generator winding 5 with the result that a direct current rectified throughout the full wave thereof by the three-phase full wave rectifier 19 charges the battery. Otherwise the rectified direct current is consumed at the electronic load of vehicles or the like. The cooling fans 11 and 12 (FIG. 2) rotate to cool the field winding 10, the three-phase generator winding 5 and the voltage regulator 18.

Next, there is illustrated an open and close control of each of the MOS power transistors 19a through 19f in the three-phase MOS power transistors 19a through 19f by the voltage regulating portion 20. The voltage regulating portion 20 reads each of the three phase generated voltages $V_U$, $V_V$, and $V_W$ which are potentials at an output terminal of each phase of the three-phase generator winding 5 so that a generated voltage between windings which is larger than the terminal voltage of the battery 21 is selected out of generated voltages between windings $V_U-V_V$, $V_V-V_W$, and $V_W-V_U$. Then one of the high side MOS power transistors 19a through 19c and one of the low side MOS power transistors 19d through 19f are turned on so that the selected generated voltage between windings is applied to the battery 21. This allows a charging current to be supplied from the selected three-phase generator winding to the battery 21.

Furthermore, the voltage regulating portion 20 detects the terminal voltage of the battery 21 like normal regulators. The detected voltage is compared with the preset reference voltage so that a switching transistor intermittently controls the exciting current to maintain the terminal voltage at a target level as in the prior art. The switching transistor may be a SiC MOS transistor.

Figure 3A:
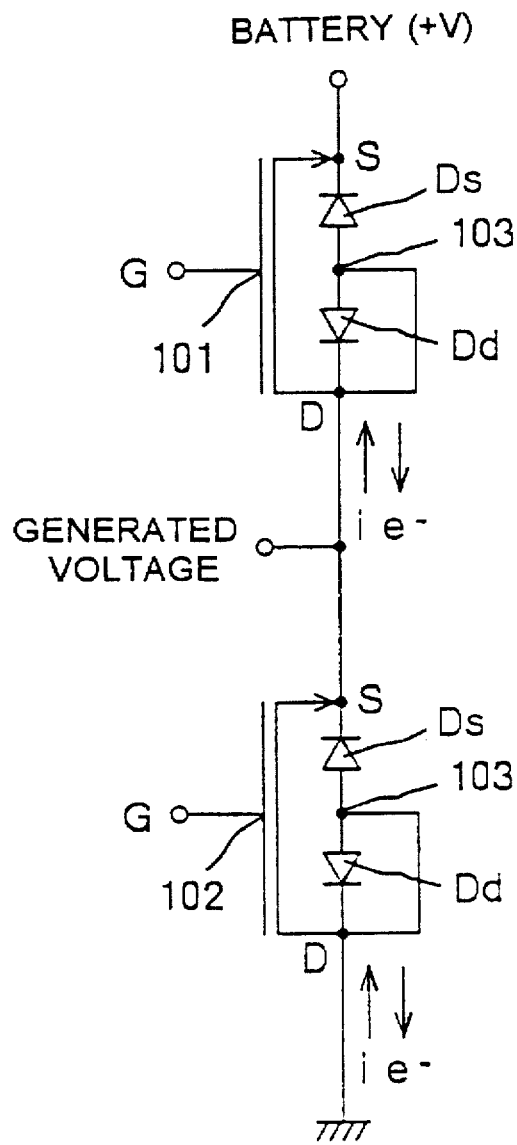
FIGS. 3(a) and 3(b) are equivalent circuit diagrams of a structure for an inverter circuit.
Figure 5:
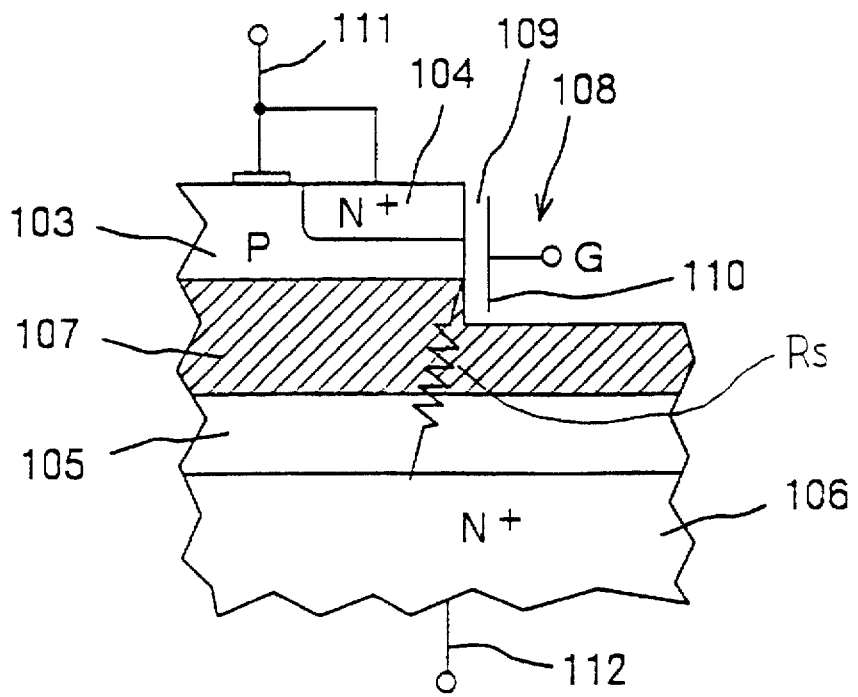
FIG. 5 is a partially enlarged sectional view showing one example of an MOS power transistor structure constituting the three-phase full wave rectifier.

The details of the three-phase full wave rectifier of the MOS power transistor type using the aforementioned SiC is explained hereinbelow in conjunction with FIGS. 3(a) and 5. FIG. 3(a) is a view of an inverter circuit, the view showing one phase portion of the three-phase full wave rectifier of the MOS power transistor type according to embodiment 1 of the present invention. FIG. 5 is a view showing part of a cross sectional structure of the MOS power transistors 19a through 19f.

In the inverter circuit of the N-channel MOS power transistors shown in FIG. 3(a), a drain electrode D of the high side MOS power transistor 101 and a source electrode S of the low side MOS power transistor are connected to one phase output terminal of the three-phase generator winding 5, a drain electrode D of the low side MOS power transistor 102 is connected to a low potential terminal of the battery 21, and a source electrode S of the high side MOS power transistor 101 is connected to a high potential terminal of the battery 21. The direction of charging current at the time of battery charge is opposite to the direction of the travel of electrons. The source electrode S refers to an electrode at which carrier electrical charge of carriers at this charging time is charged to the channel.

Figure 3B:
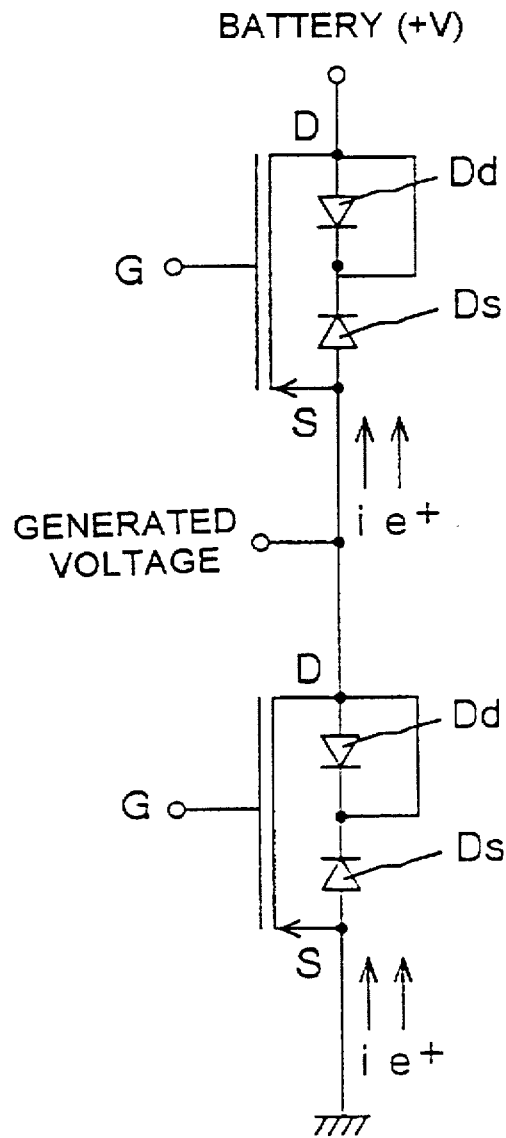

In the MOS power transistors 101 and 102, as shown in FIG. 3(a) and 3(b), a source connected side parasitic diode Ds and a drain connected side parasitic diode Dd are generated between the P-type Well region 103 that will be described later (namely, a region immediately under the gate electrode 101) and the source electrode S or the drain electrode D. However, the P-type well region 103 and the drain electrode D are short-circuited out of the necessity of adding electrons to the P-type well region 103. The reason for this fact is already described. This enables the source-connected side parasitic diode Ds to prevent the aforementioned reverse current from the battery 21.

Next, part of the cross sectional structure of the MOS power transistor according to embodiment 1 will be explained in conjunction with FIG. 5.

On the SiC N$^+$-type substrate 106, an N-type withstand voltage layer 105 is epitaxially grown and formed. Further, on the surface portion of the N-type withstand voltage layer 105, a P-type well region 103 is formed by ion implantation of aluminum. Further, on the surface portion of the P-type well region 103, an N$^+$-type region 104 is formed by ion implantation of nitrogen. Then, an opening is formed on a region of a wafer surface where a trench is to be formed, followed by masking the trench with a resist or an insulating film to provide a trench 108 in a recessed configuration by the known dry etching called the reactive ion etching (R.I.E.). After that, on the surface of the trench 108, a gate insulating film 109 formed of silicon oxide film is formed on the surface of the trench 108 with the thermal oxidation process followed by forming in the trench 108 a gate electrode 110 of doped polysilicon. Then the metal electrode 111 is allowed to contact the N$^+$-type region (drain electrode) and the surface 104 of the P-type well region followed by allowing the metal electrode 112 to contact the surface of the N$^+$-type substrate (source electrode) 106 thereby completing an element.

Therefore, in embodiment 1, when a high voltage (for example, +300 volts) is applied between the source electrode 106 and the drain electrode 111 during the turning off of the MOS power transistor, a depletion layer swells primarily toward the n-type pressure withstand voltage layer 105 to endure such a high voltage. Consequently, the N-type withstand voltage layer 105 serves as a source feedback resistance Rs. As described above, the resistance itself and the channel resistance increasing effect generate a power loss.

However, since a single crystal SiC is used as the material in embodiment 1, the thickness of the N-type withstand voltage layer 105 and the impurity concentration can be largely improved compared with the conventional Si.

The design condition of the N-type withstand voltage layer 105 is considered when the withstand voltage of the N-type withstand voltage layer 105 is set to 300 volts.

The breakdown electric field strength of Si is about 30 V/μm. When it is simply thought that the N-type withstand voltage layer 107 endures the withstand voltage of 300 volts, the required thickness of the withstand voltage layer is about 20 μm, the impurity concentration thereof is $1 \times 10^{15}$ atoms/cm$^2$, and the resistivity is about 5 Ωcm.

On the other hand, the breakdown electric field strength of SiC is about 400 V/μm. When it is simply thought that the N-type withstand voltage layer 105 endures the withstand voltage of 300 volts, the required thickness of the withstand voltage layer is about 4 μm, the impurity concentration thereof is $2 \times 10^{16}$ atoms/cm$^2$, and the resistivity is about 1.25 Ωcm.

Hence, the resistance of the N-type withstand voltage layer 107 of the SiC MOS power transistor can be reduced to 1/20 that of the N-type withstand voltage layer 107 of the Si MOS power transistor. As described above, the channel resistance can be largely reduced along with it. With this synergistic effect, a three-phase full wave rectifier for motor vehicles with low loss can be realized.

In other words, it has been made clear that a three-phase full wave rectifier having an excellent effect that cannot be predicted from the prior art can be realized by improving the breakdown electric field strength of the N-type withstand voltage layer 105 with the adoption of SiC.

The aforementioned relation is naturally the same even when a high voltage other than 300 volts is applied to the N-type withstand voltage layer 105.

Figure 6:
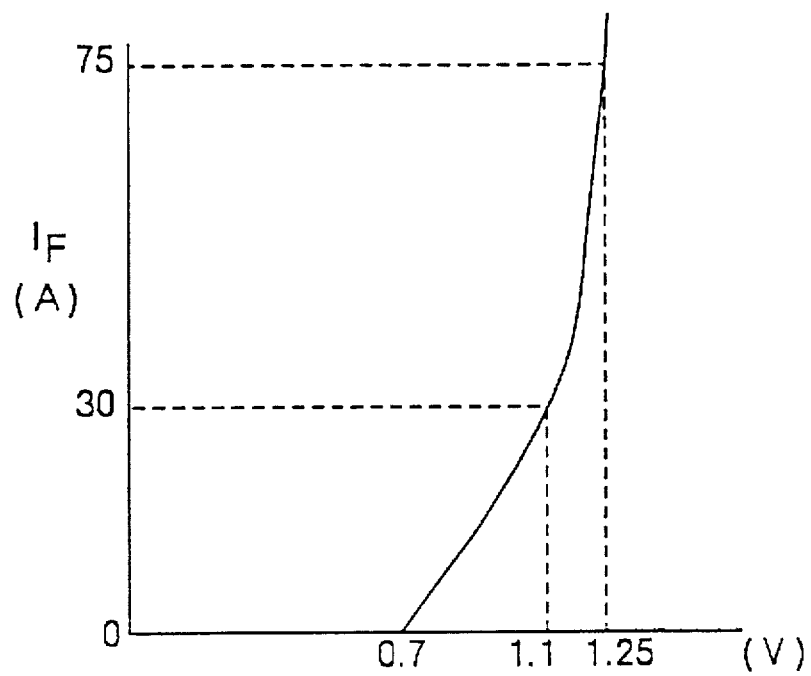
FIG. 6 is a view of voltage-to-current properties in a PN diode formed of Si.
Figure 7:
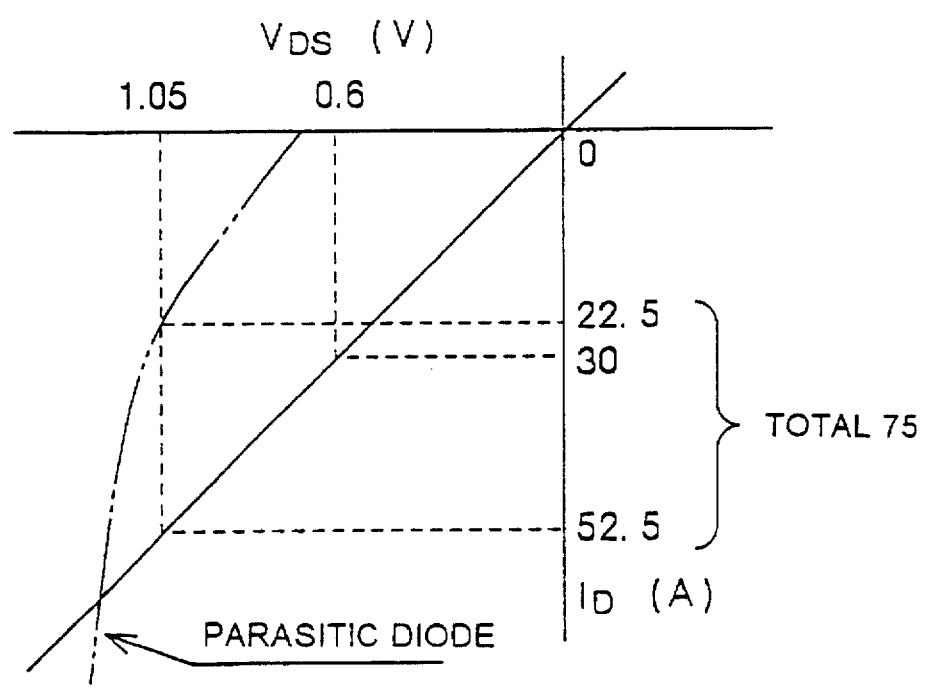
FIG. 7 is a view of voltage-to-current properties in a MOS power transistor formed of Si.
Figure 8:
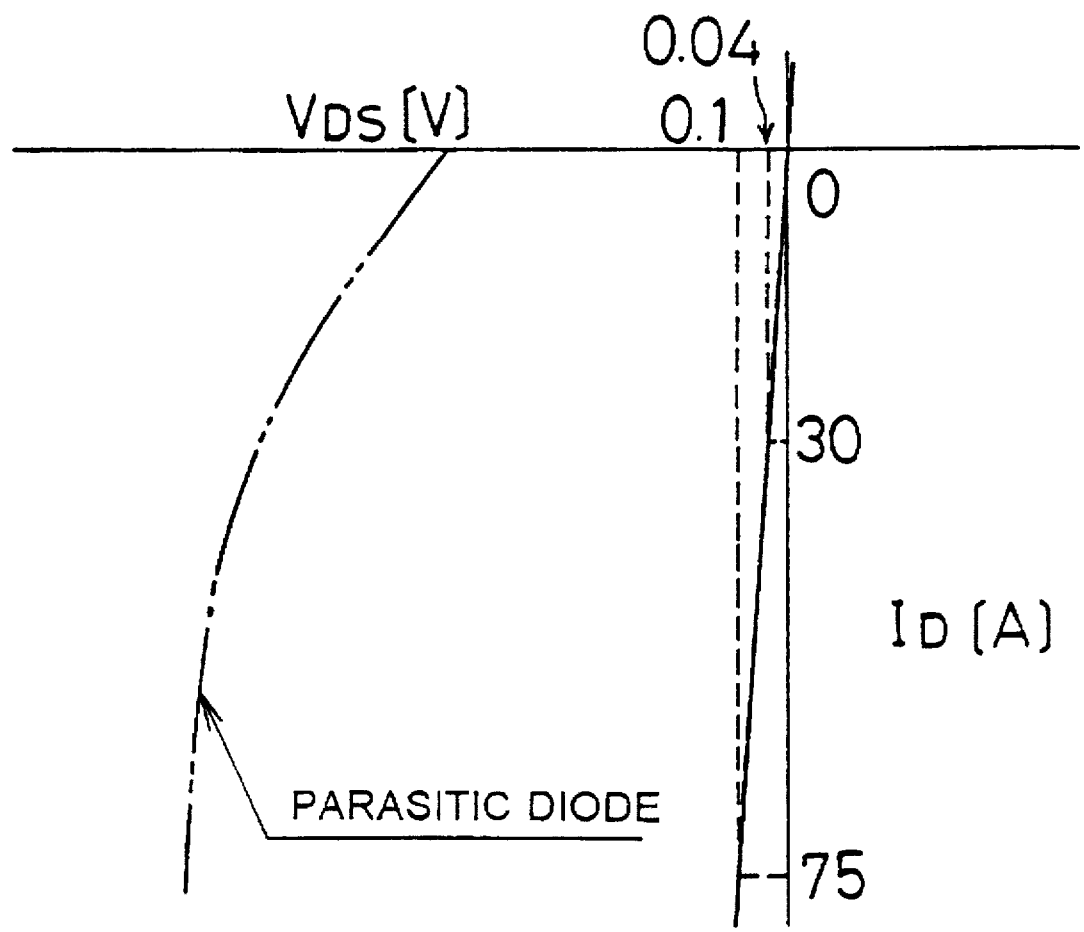
FIG. 8 is a view of voltage-to-current properties in a MOS power transistor formed of SiC of an embodiment of the present invention.

FIGS. 6 through 8 show voltage-to-current properties of an Si diode, an Si MOS power transistor, and an SiC MOS power transistor manufactured with the same chip size and the design rule. However, the withstand voltage is set to 250 volts. FIG. 6 shows Si diode properties. FIG. 7 shows Si MOS power transistor properties. FIG. 8 shows experimental properties of a SiC MOS power transistor. As shown in FIGS. 6 through 8, the three-phase full wave rectifier 19 of embodiment 1 can reduce power loss by 90% or more compared with the conventional three-phase full wave rectifier under the condition of the output current of 75 A.

Figure 9:
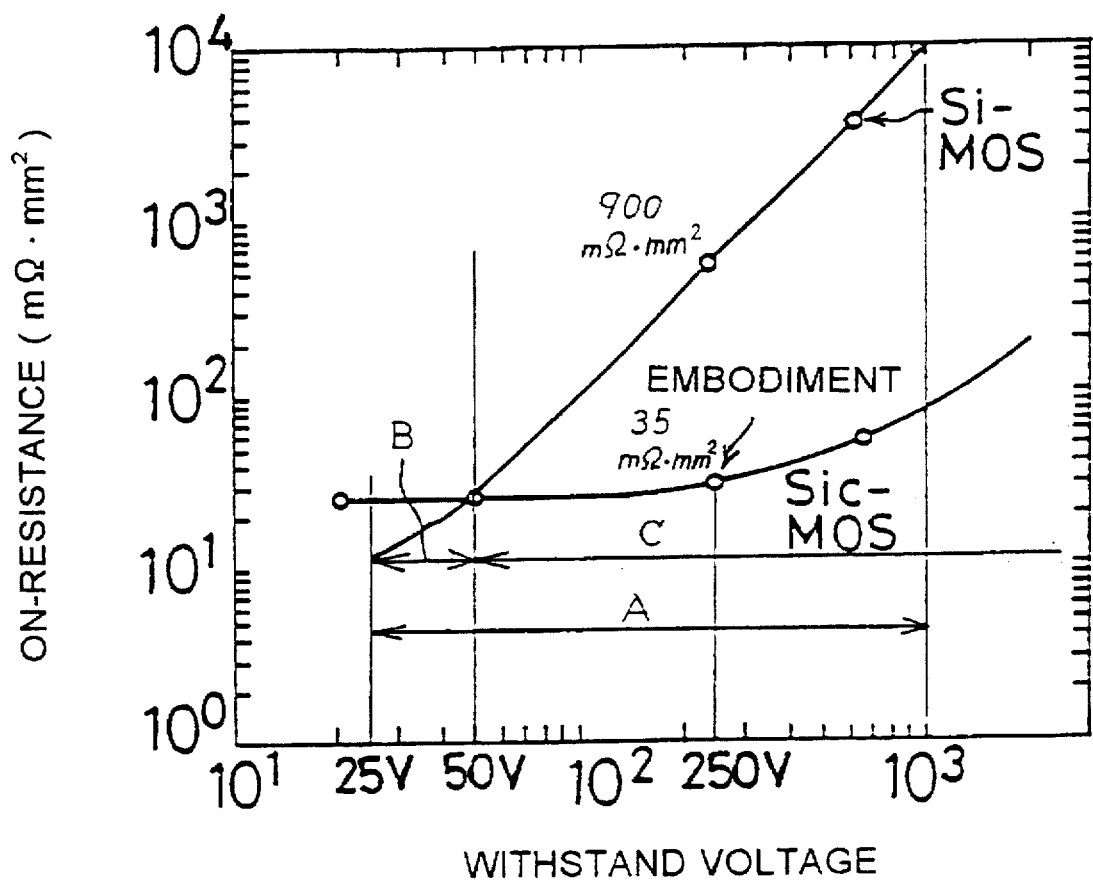
FIG. 9 is a view showing the relationship between a channel resistance and a withstand voltage in the MOS power transistor shown in FIGS. 7 and 8.

FIG. 9 shows one example of calculation result with respect to ON resistance when the required withstand voltage of the MOS power transistor is changed. Incidentally, the ON resistivity is a sum of the channel resistance and the resistance of the N-type withstand voltage layer 105. In particular, the channel resistance varies with each kind of filter. However, as shown in FIG. 9, the aforementioned resistance of the N-type withstand voltage layer 105 becomes predominant in the high pressure resistant region.

In other words, the channel resistance itself does not virtually change even with an increase in the withstand voltage (when an increase in the channel resistance is ignored which results from the aforementioned feedback effect caused by an increase in the source parasitic resistance Rs), the resistance of the N-type withstand voltage layer 105 increases while a positive correlation is maintained with respect to the withstand voltage. Consequently, the ON resistivity increases in proportion to an increase in the withstand voltage from a level in the vicinity of a withstand voltage of 25 volts. However, it has been made clear that an increase in resistance of the N-type withstand voltage layer 105 can be almost ignored up to a level of a withstand voltage of 250 volts in SiC, and the ON resistivity slowly increases only after the withstand voltage exceeds a withstand voltage of 250 volts.

As apparent from FIG. 9, in a range A which shows a desired withstand voltage range for a current element installed in an alternator, SiC element of this embodiment is more effective as the above current element (range C). Range B (50 volts or less) shows a range wherein Si element is effective.

Figure 10:
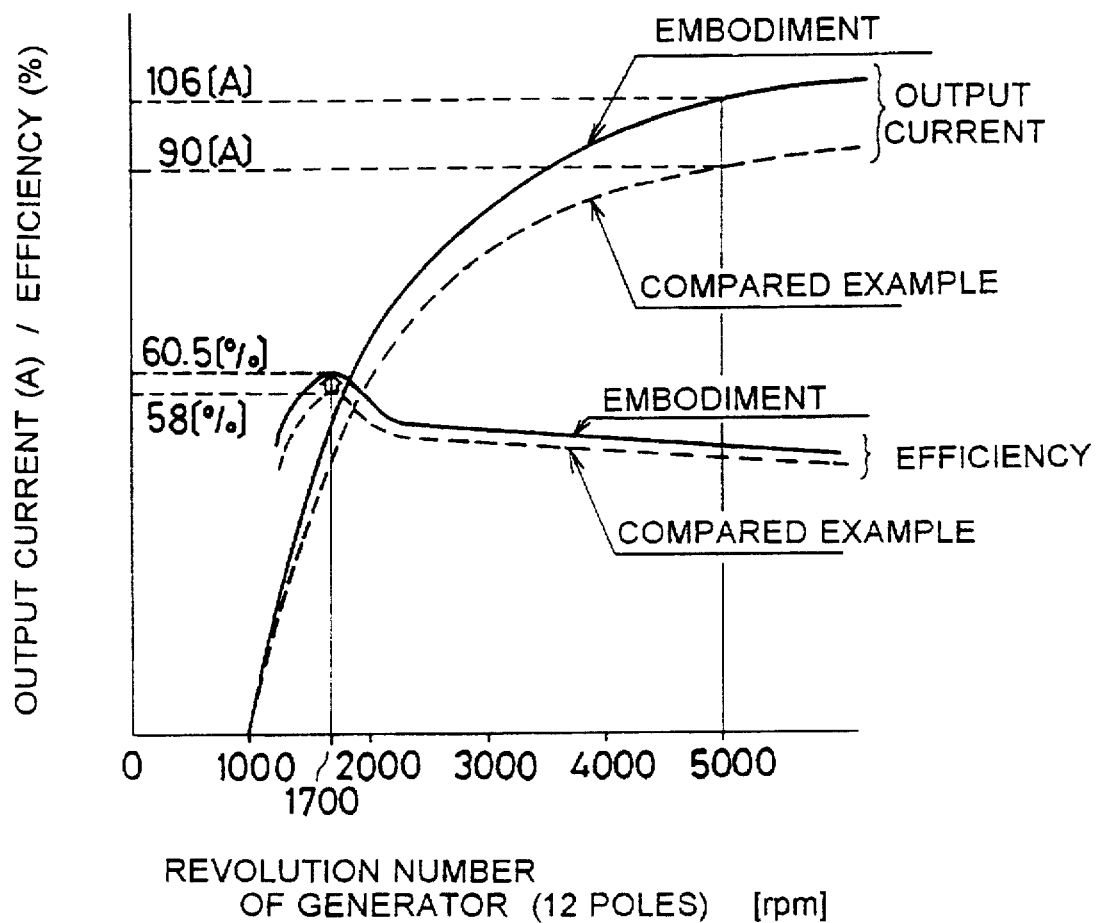
FIG. 10 is a view showing the relationship between an output current, efficiency and revolution number is the A. C. generator for motor vehicles when a three-phase full wave rectifier of the Si-MOS power transistor type and a three-phase full wave rectifier of the SiC-MOS power transistor type are used.
Figure 11:
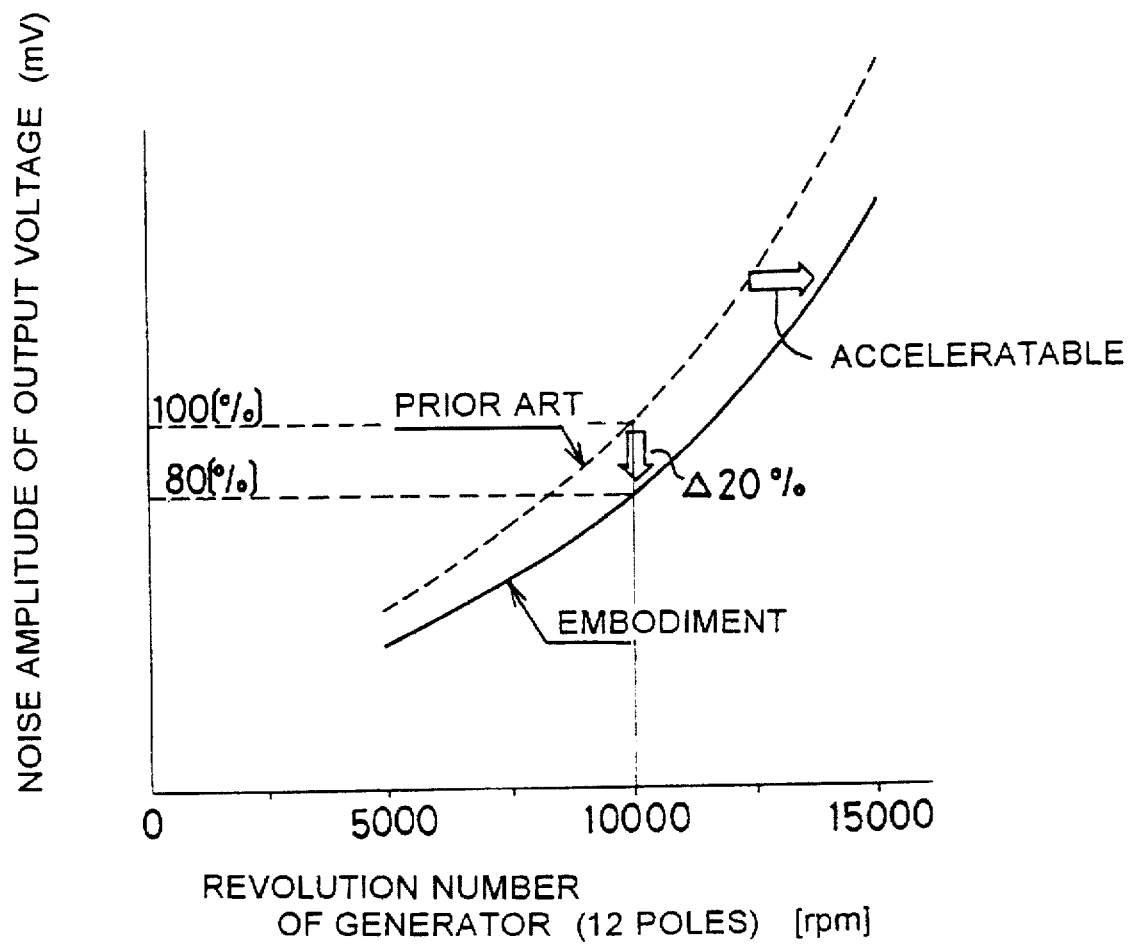
FIG. 11 is a view showing the relationship between a noise voltage and a revolution number in the A. C. generator for motor vehicles when the three-phase full wave rectifier of the Si-MOS power transistor type and the three-phase full wave rectifier of the SiC-MOS power transistor type are used.

FIGS. 10 and 11 show properties of the A. C. generator for motor vehicles according to embodiment 1 in which a three-phase full wave rectifier 19 incorporating an SiC MOS power transistor and an Si MOS power transistor (comparative example) both having the same chip size.

The output current is improved by about 10% (at the time of 12 poles and 5000 rpm). In addition, since the loss of rectified current can be almost ignored, the rectifying efficiency can be improved by about 3 to 5%.

Figure 12:
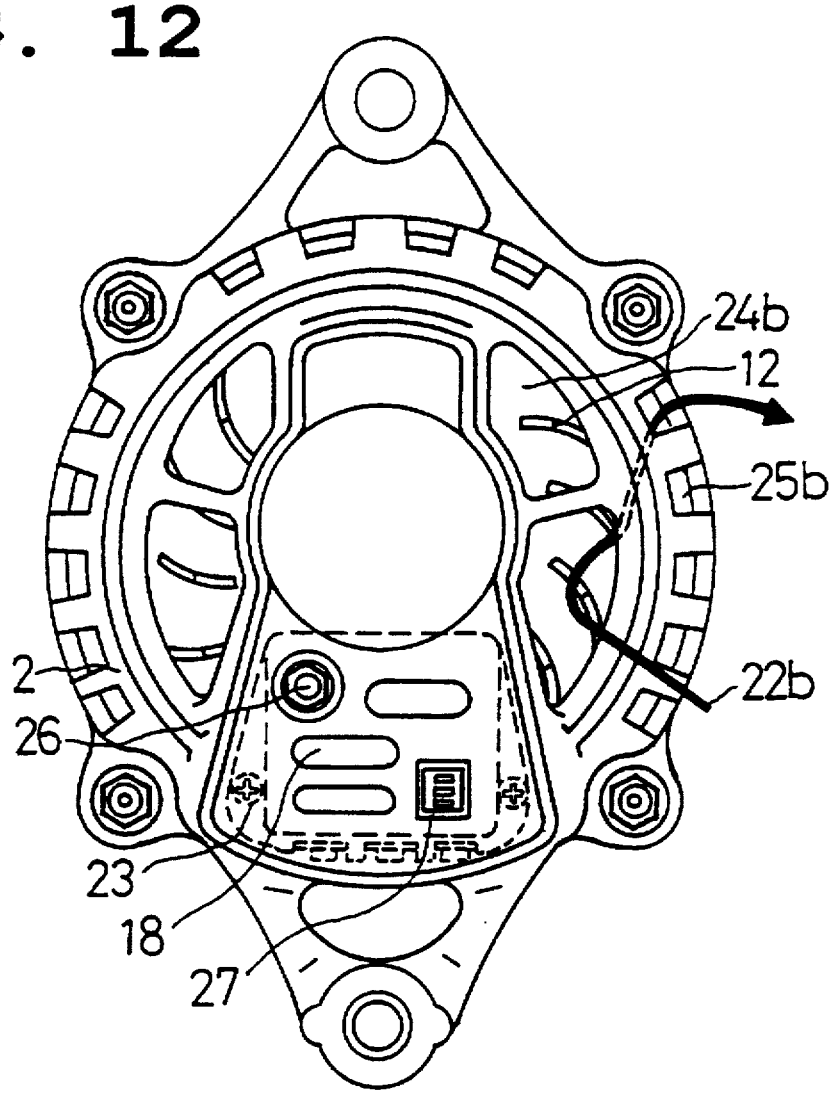
FIG. 12 is a side view showing a rear side of the A. C. generator for motor vehicles, perspectively showing the three-phase full wave rectifier.
Figure 13:
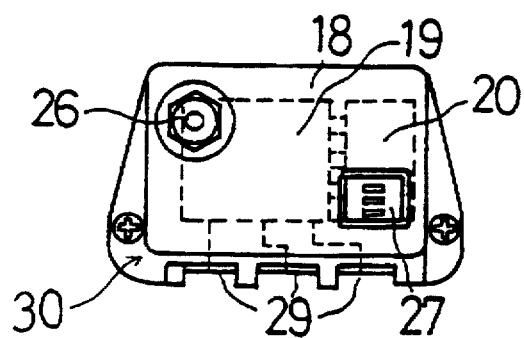
FIG. 13 is an internal perspective plan view of the three-phase full wave rectifier of FIG. 12.

Additionally, since heating from the three-phase full wave rectifier 19 is largely lowered, the radiating fan can be reduced in size. As shown in FIG. 13, the three-phase full wave rectifier 19 and the voltage regulating portion 20 can be integrated in the same case 30. Furthermore, by integrating the three-phase full wave rectifier 19 and the voltage regulating portion 20, wiring connecting the three-phase full wave rectifier 19 and the voltage regulating portion 20 can be omitted. An electromagnetic radiation noise produced from this wiring can be reduced. Compared with the conventional generator, as shown in FIG. 12, an inlet window for absorbing cooling air can be exposed without being directly covered. As a consequence, the mounting space of three-phase full wave rectifier 19 can be reduced, and the ventilation resistance and ventilation power can also be reduced.

Furthermore, in embodiment 1, as shown in FIG. 11, it has been made clear that when a generator having a specification of 12 poles and 100 A is rotated at 10000 rpm, the SiC three-phase full wave rectifier 19 can reduce the noise voltage included in the rectified output voltage by about 20% compared with the conventional Si three-phase full wave rectifier. This is because the potential change between both ends of the three-phase full wave generator winding 5 resulting from the turning on and off of the MOS power transistors 19a through 19f is suppressed because the MOS power transistors 19a through 19f have small resistances.

Furthermore, in the aforementioned embodiment, the three-phase full wave rectifier 19 incorporating voltage regulator 18 is accommodated inside the generator. The aforementioned voltage regulator 18 can be arranged on the outside wall of the generator or outside of the generator separated from the generator. However, the three-phase full wave rectifier 19 and the voltage regulating portion 20 can be constituted separately.

Furthermore, an external phase generator other than the three-phase generator can be constituted in the same manner.

Incidentally, FIG. 12 is a view showing a three-phase full wave rectifier incorporating a voltage regulator 18 as seen from the axial direction of the alternator shown in FIG. 2. FIG. 13 is a view showing an internal perspective enlarged view of the three-phase full wave rectifier 19 incorporating voltage regulator 18 shown in FIG. 12. In FIGS. 12 and 13, numeral 26 denotes DC current output terminal, 27 denotes a connector such as key switch signal and battery voltage signal, 29 is a terminal base for connecting generator windings. Further, 22b is a cooling air flowing from an inlet 24b to an outlet 25b.

Embodiment 2

Figure 14:
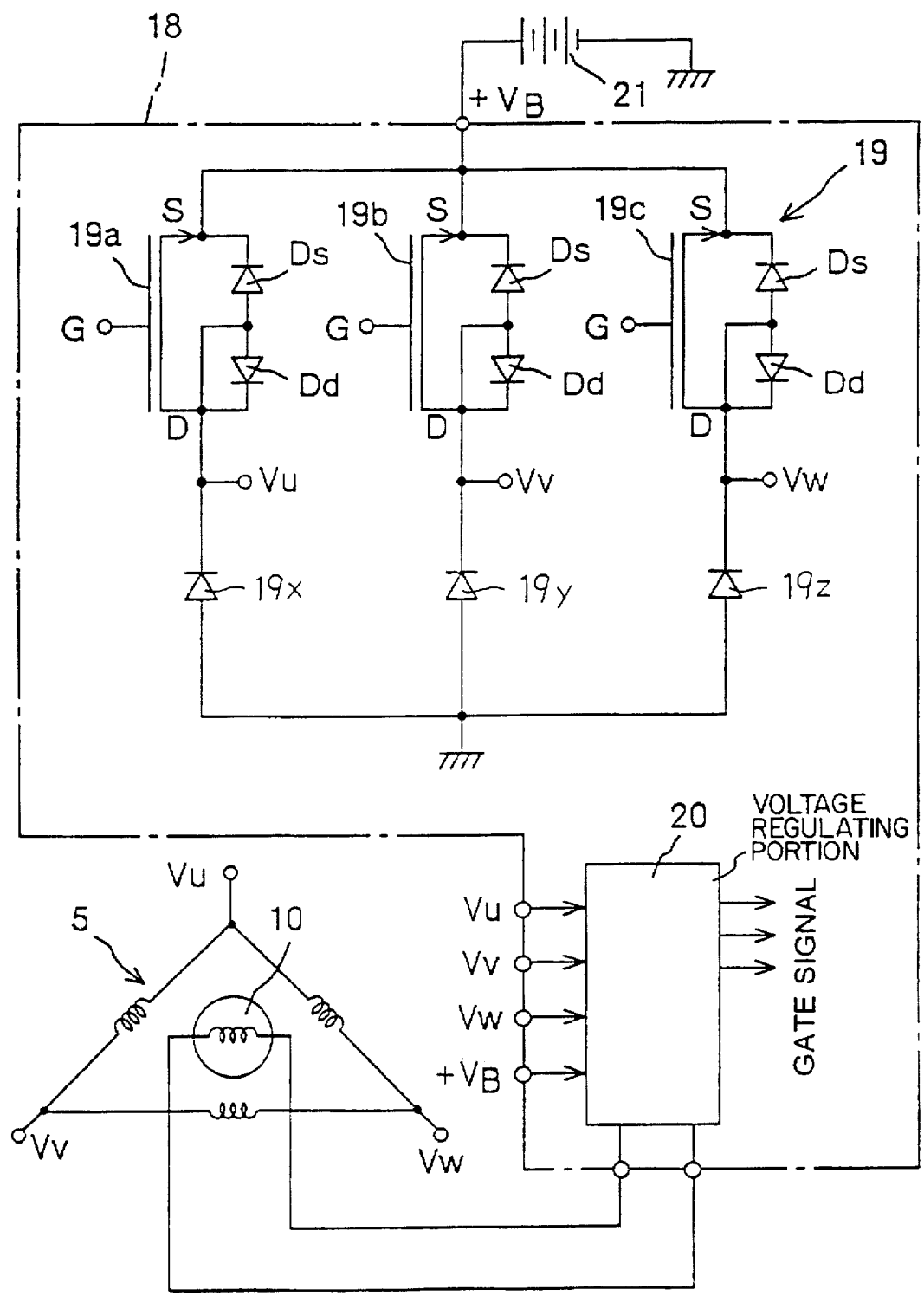
FIG. 14 is an equivalent circuit diagram showing a second embodiment of the present invention.

Embodiment 2 of the present invention will be explained in conjunction with FIG. 14.

In embodiment 2, only high side MOS power transistors in the three-phase full wave rectifier 19 are formed of SiC whereas low side semiconductor power elements are constituted with PN diodes 19X, 19Y and 19Z formed of conventional Si. Thus embodiment 2 can have an advantage of reduction in power loss and simplification of cooling though the advantage of embodiment 2 is smaller than that of embodiment 1.

It goes without saying that only low side MOS power transistors are formed of SiC whereas high side semiconductor power elements are constituted of PN diodes formed of conventional Si. In place of the aforementioned PN diodes, MOS power transistors formed of Si can be adopted.

Embodiment 3

Figure 15:
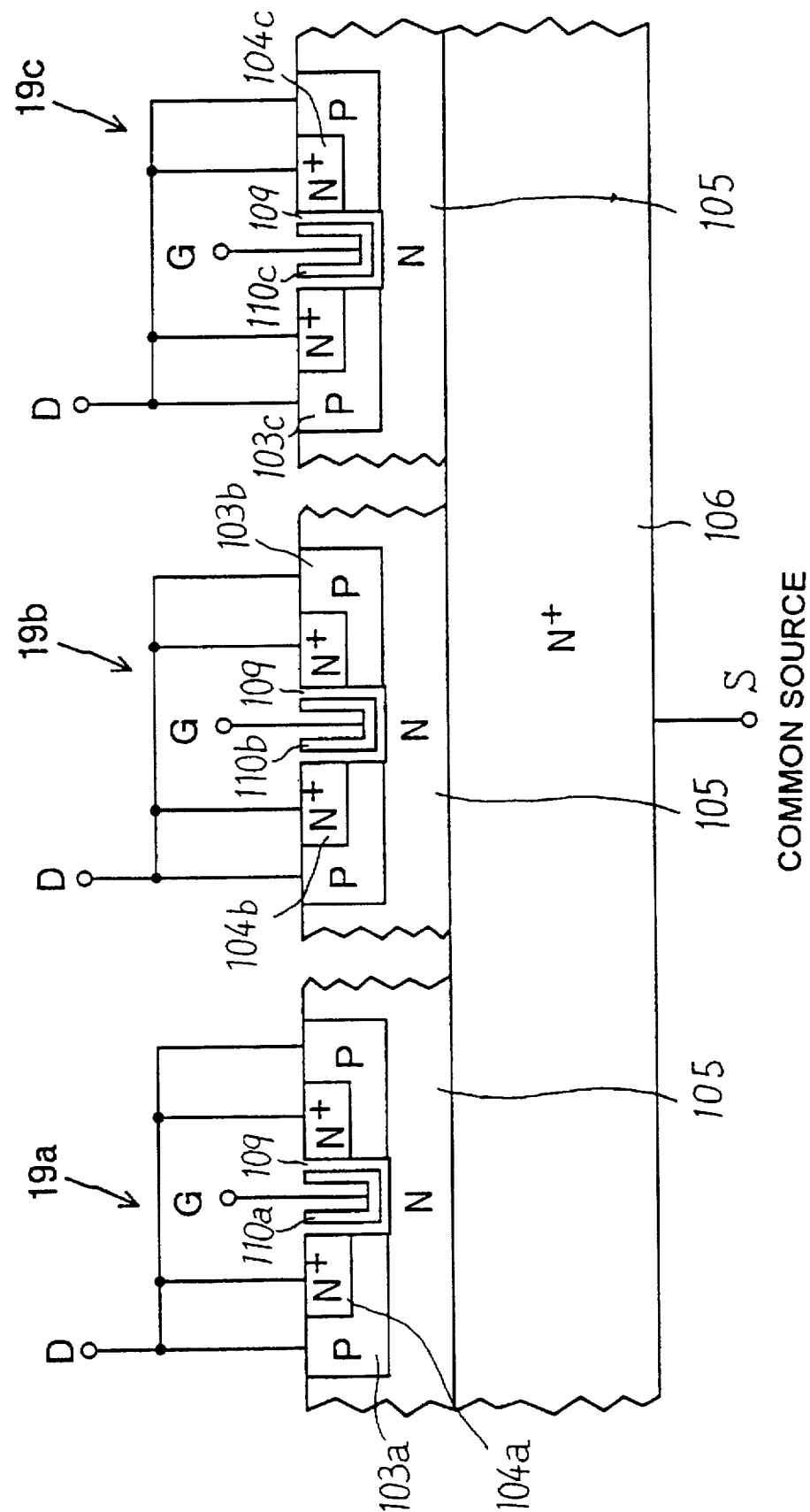
FIG. 15 is a sectional view showing a third embodiment of the present invention.

Embodiment 3 of the present is explained in conjunction with FIG. 15.

In embodiment 3, the N$^+$-type substrate 106 constitutes a common source electrode (refer to FIG. 1) of each of high side MOS power transistors 19a through 19c. On the substrate 106, P-type well regions 103a through 103c in each phase are individually formed sufficiently separated from each other by a distance that disables mutual punch-through. On the surface portion of each of the P-type well regions 103a through 103c N$^+$-type drain regions 104a through 104c are individually formed whereas on the surface portion of each of P-type well regions 103a through 103c gate electrodes 110a through 110c are arranged via an insulating film 109. The drain regions 104a through 104c are individually connected by conduction to gate electrodes 110a through 110c with a withstand voltage layer 105.

This enables embodiment 3 to exhibit an excellent advantage in that a half bridge comprising three high side MOS power transistors can be accumulated on one chip without increasing any step of the manufacturing process. Furthermore, power loss in each of the MOS power transistors 19a through 19c is so small that a temperature rise in each element can be avoided as a result of integration thereof.

Embodiment 4

Figure 16:
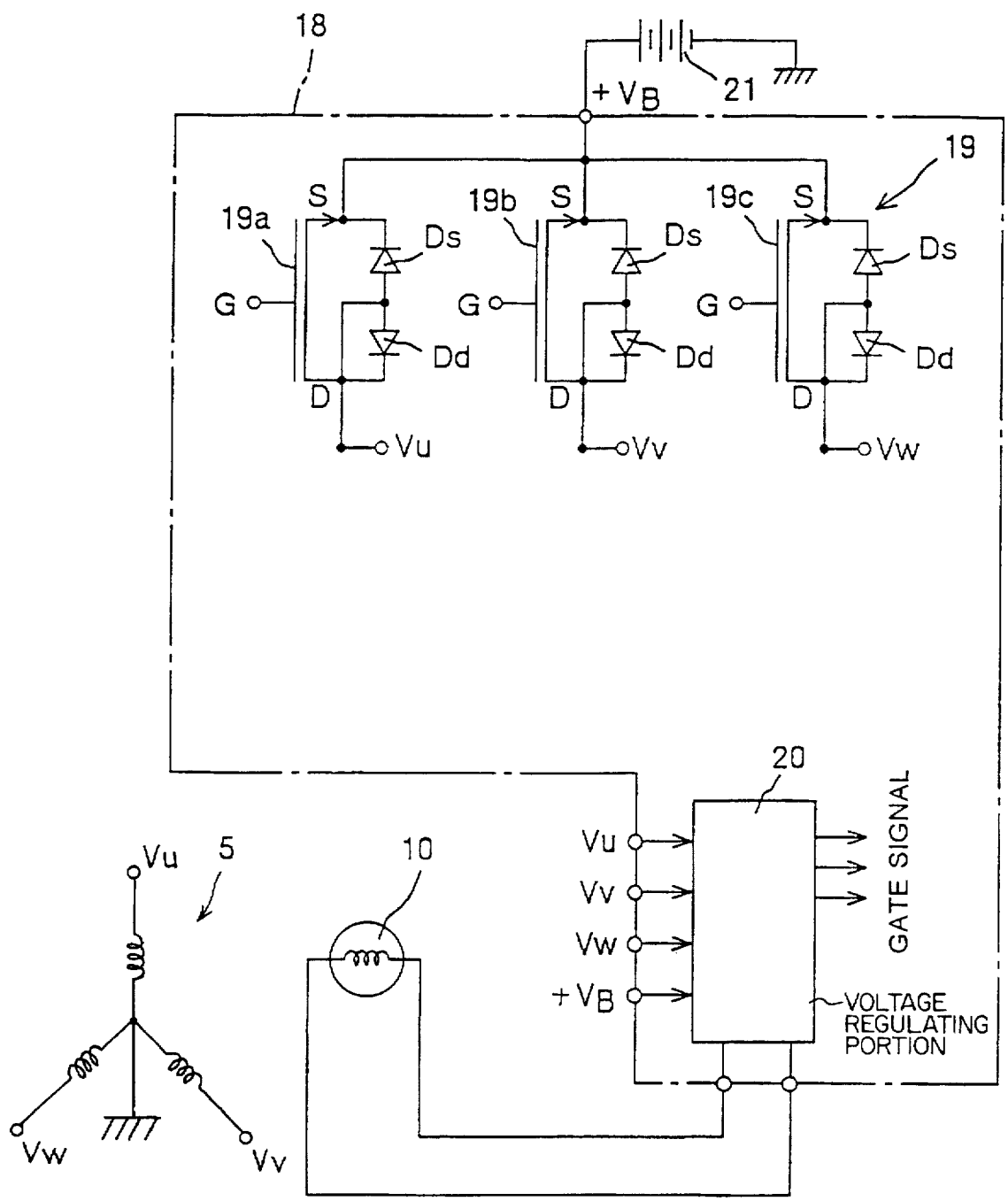
FIG. 16 is a equivalent circuit diagram showing a fourth embodiment of present invention.

In embodiment 4 shown in FIG. 16, SiC MOS power transistors are arranged between high potential terminals of a battery 21 and the output terminal of each phase generator winding 5. On the other hand, the neutral point of the three-phase generator winding is connected to a low potential terminal of the battery 21.

A voltage regulating portion 20 reads the voltages $V_U$, $V_V$ and $V_W$ in each phase of the three-phase generator winding with respect to the low potential terminal of the battery. Out of the voltages, a winding voltage which is larger than the terminal voltage of the battery 21 is selected so that the MOS power transistor corresponding to the phase thereof is turned on.

This allows an output voltage obtained by half wave rectifying the three-phase alternating current to be supplied to the battery 21. When a high surge voltage is generated as a result of an interruption of a charge wiring connected to the battery, a voltage is applied to two elements, or a high side and a low side element which are connected in series in the aforementioned full wave rectifier. On the other hand, a high voltage is applied to one element in the half wave rectification of embodiment 3, the element requires about a two times larger withstand voltage. Consequently, the loss reduction effect is even larger through the use of SiC MOS transistors having a high withstand voltage and a low power loss.

It goes without saying that the MOS power transistors may be arranged on the low potential terminal of the battery whereas the neutral point of the winding may be connected to the high potential terminal of the battery. The neutral point may be allowed to float. In this embodiment, the generator winding may not be the three-phase winding.

Incidentally, the MOS power transistors 19a through 19f in each of the aforementioned embodiments are designed through the use of 6H-SiC as a material and with a withstand voltage of 300 volts. There is theoretically illustrated hereinbelow the result of the analysis (refer to FIG. 9) of the resistances in the three-phase full wave rectifier 19 for motor vehicles using this 6H-SiC MOS power transistors 19a through 19f and the three-phase full wave rectifier 19 for motor vehicles using Si MOS power transistors. The channel resistance increase effect is ignored here which results from the feedback effect of the source parasitic resistance Rs. In addition, the circuit assumes a vertical construction shown in FIG. 5 with the same chip area.

The resistance R of the transistor is a sum of the channel resistance rc and a resistance rb of the N$^+$-type withstand voltage layer 105.

Let the following equations be established;

$$rc = L/W \cdot (1/\mu s \cdot \epsilon s \cdot \epsilon o)^{-1} \cdot (Tox/(Vg - Vt))$$

$$rb = 4Vb^2 \cdot (1/\mu \cdot \epsilon s \cdot \epsilon o \cdot Ec \cdot A)$$

Then the resistance of the SiC MOS power transistor is reduced to about 1/15 that of the Si MOS power transistor.

However, Si has a breakdown electric field strength Ec of $3 \times 10^5$ V/cm and SiC has a breakdown electric field strength Ec of $3 \times 10^6$ V/cm. On the other hand, Si has a specific dielectric rate $\epsilon s$ of 11.8 and SiC has a specific dielectric rate $\epsilon s$ of 10.0. Both Si and SiC have an area A of 1 mm$^2$. Symbol Vb designates a breakdown voltage (withstand voltage).

Furthermore, symbol $\mu$ designates a bulk mobility of electrons. Si has a bulk mobility $\mu$ of 1100 cm$^2$/(V·C) and SiC has a bulk mobility $\mu$ of 370 cm$^2$/(V·C). Both Si and SiC have a channel length L of 1 μm, and a channel width W of 222 μm. Symbol μs designates a channel mobility. The channel mobility μs of Si is set to 500 cm$^2$/(V·C) and the channel mobility μs of SiC is set to 100 cm$^2$/(V·C).

The aforementioned equation shows that SiC has smaller resistance than Si when the withstand voltage is 50 volts or more. Incidentally, since the substrate serves as a drain in the aforementioned equation, the resistance of Si should remarkably increase because of an increase in the channel resistance due to the feedback effect of the source parasitic resistance Rs described above when the substrate serves as a source.

Therefore, it can be presumed that the resistance of the SiC MOS power transistors becomes low without fail when the withstand voltage is 100 volts or more even if the design rule somewhat changes.

Incidentally, the P-type well region 103 is formed with ion implantation in each of the aforementioned embodiments. In the construction shown in FIG. 5, the P-type well region 103 can be epitaxially grown and formed.

Embodiment 5

Figure 17:
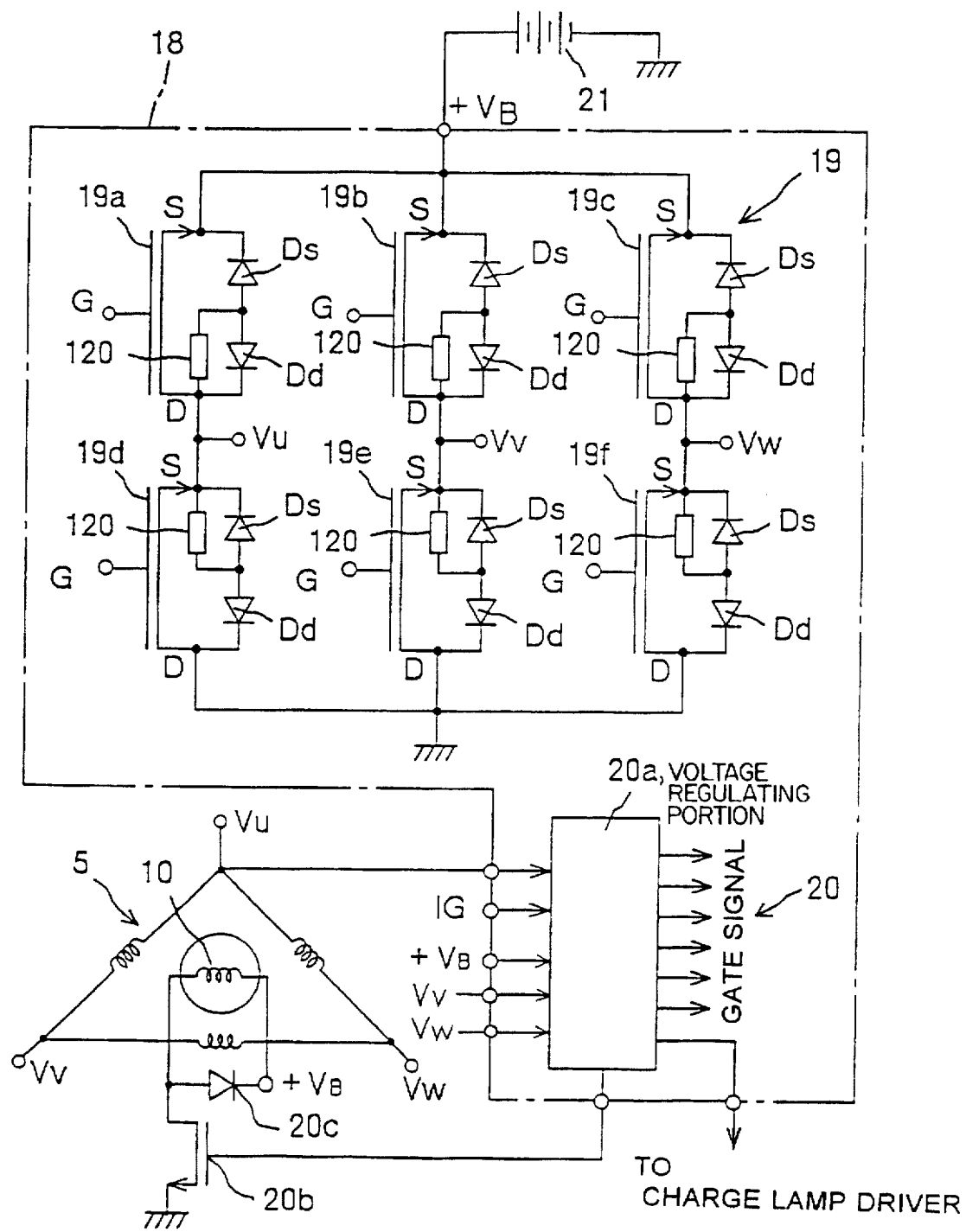
FIG. 17 is a circuit diagram of the A. C. generator according to a fifth embodiment of the present invention.

Embodiment 5 is explained in conjunction with FIG. 17. Like embodiment 1, a voltage regulator 18 comprises a three-phase full wave rectifier 19 and a voltage regulating portion 20. The three-phase full wave rectifier 19 comprises MOS power transistors 19a through 19c of the N-channel enhancement type, the transistors being formed of single crystal SiC.

The voltage regulating portion 20 comprises a controller 20a, a switching transistor 20b and a flywheel diode 20c. The controller 20a PWM-controls the switching transistor 20b based on a battery voltage $V_B$. Then, an exciting current passing through a field winding 10 from a battery 21 via a brush 16 and a slip ring 17 is controlled through the switching transistor 20b.

Incidentally, as described hereinafter, the switching transistor 20b is formed of single crystal SiC. The switching transistor 20b is integrated on the same chip as the low side MOS power transistors 19d through 19f in the three-phase full wave rectifier 19.

Figure 18:
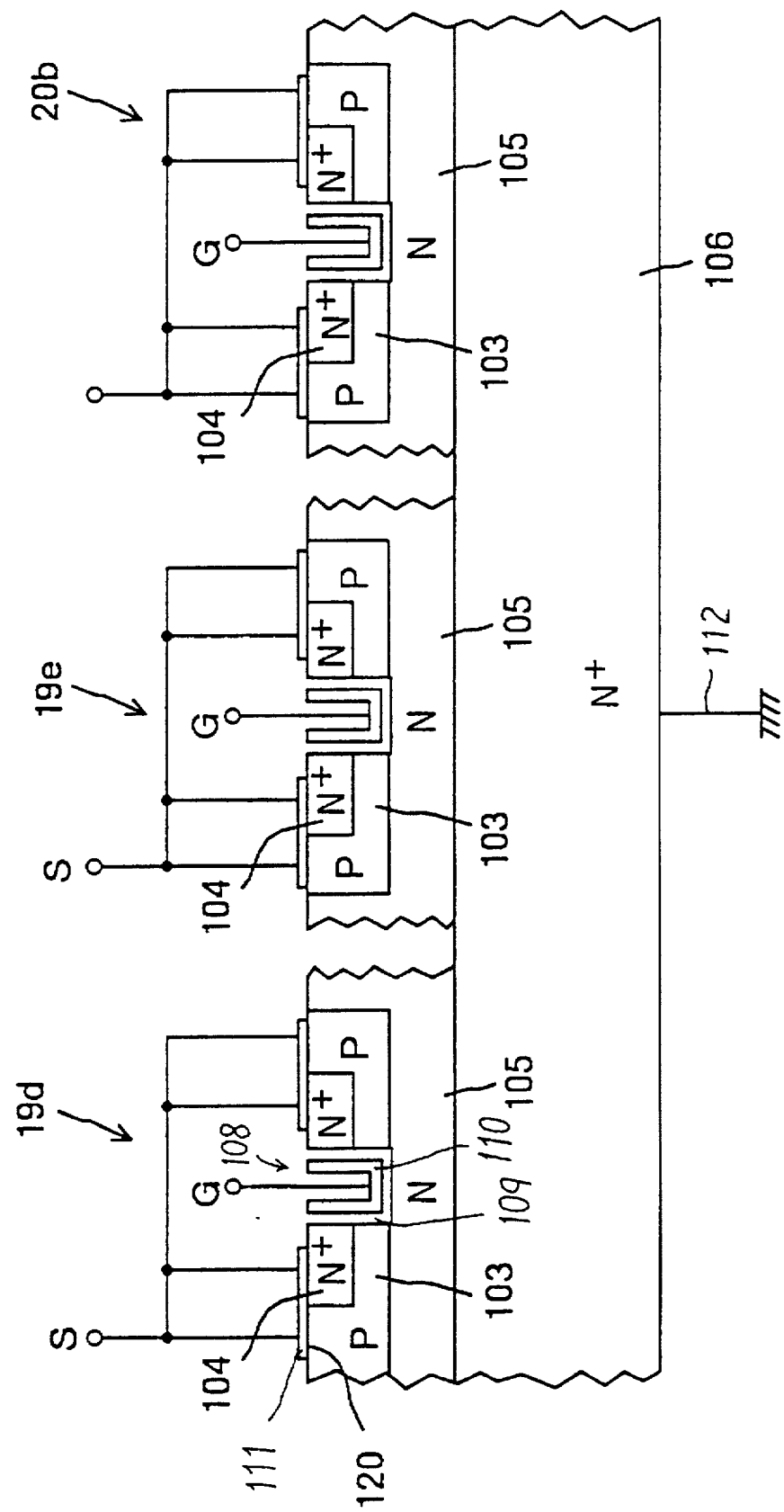
FIG. 18 is a sectional view of low side MOS power transistors and a switching transistor 20b in the three-phase full wave rectifier 19 in FIG. 17.

The three-phase full wave rectifier of the N-channel MOS power transistor type using the aforementioned single crystal 6H-SiC and the switching transistor 20b is explained in detail hereinafter in conjunction with FIGS. 17 and 18. However, FIG. 18 shows a cross sectional construction of the MOS power transistors 19d and 19e and the switching transistor 20b.

Each of the MOS power transistors 19a through 19f in the three-phase full wave rectifier 19 is subsequently turned on and off with the controller 20a to rectify the three-phase full wave current.

Reference numeral 120 designates a high resistance body for adding potential to the P-type well region 103 located immediately under a gate electrode. The high resistant body assumes a resistance of 150 ohms or more.

The high resistance body 120 in high side MOS power transistors 19a through 19c is connected in parallel to the drain connected parasitic diode Dd whereas the high resistant body 120 in the low side MOS power transistors 19d through 19f is connected in parallel to the source connected parasitic diode Ds.

In such a construction, a common source of high side MOS power transistors 19a through 19c can have a withstand voltage layer between the source and the respective P-type well regions 103. Thus, these high side MOS power transistors 19a through 19c can be integrated on the same chip as shown in FIG. 15.

Further, a common drain of low side MOS power transistors 19d through 19f can have a withstand voltage layer between the drain and the respective P-type well regions 103. Thus, these low side MOS power transistors 19d through 19f can be integrated on the same chip as shown in FIG. 18. Incidentally because of insufficient space, FIG. 18 does not show the MOS power transistor 19f.

Furthermore, in this particular embodiment, a power loss, or heating in these MOS power transistors 19a through 19f can be largely reduced, and the required chip area can be reduced. Thus the switching transistor 20b is integrated on the same SiC chip as the low side MOS power transistors 19d through 19f. Namely, the three-phase full wave rectifier 19 and the switching transistor 20b can be integrated on two chips.

Additionally, referring to FIG. 18, reference numeral 103 designates a P-type well region, 104 an N⁺-type source region, 105 an N-type withstand voltage layer, and 106 an N⁺-type substrate (common drain region).

Next, there is illustrated hereinafter a method for manufacturing the MOS power transistors 19a through 19f and the switching transistor 20b according to embodiment 5.

On the 6H-SiC N⁺-type substrate 106, an N-type withstand voltage layer 105 is epitaxially grown and formed.

On the surface portion of the N-type withstand voltage layer 105, a P-type well region 103 is formed by ion implantation of aluminum. Further, on the surface portion of the P-type well region 103, the N⁺-type region 104 is formed by ion implantation of nitrogen. Then an opening is formed on a region on the wafer surface where a trench is to be formed. Then the opening is masked with resist and insulating film followed by forming a trench in a recessed configuration by the known R.I.E. dry etching. After that, a gate insulating film 109 formed of silicon oxide film is formed by thermal oxidation followed by forming a gate electrode 110 formed of doped polysilicon in the trench 108. After the process, the metal electrode 111 is allowed to contact the N⁺-type region (drain electrode) and the surface 104 of the P-type well region. Then the metal electrode 112 is allowed to contact the N⁺-type substrate (source electrode) 106 thereby completing the element.

Table 1 shows an example of theoretical calculation of each kind of performance of Si bipolar transistors, Si MOS power transistors, and SiC MOS power transistors manufactured in the same size and under the same design rule.

Figure 22:
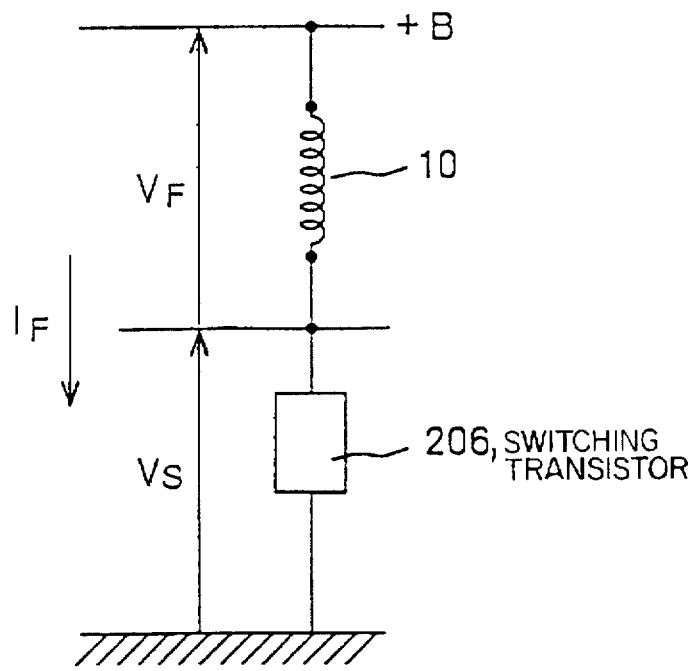
FIG. 22 is an equivalent circuit diagram showing part of the circuit of FIG. 20.

However, the theoretical calculation thereof is performed based on a circuit shown in FIG. 22 assuming that an effective chip area of each element is the same (16 mm² in this embodiment) and the design rule for both types of MOS power transistors is the same.

TABLE 1

| | | | B voltage 14 volts field winding resistance: 2.9 ohms | | |
| --- | --- | --- | --- | --- | --- |
| | ON resistance (mohm) | Voltage drop VS (V) | Field winding voltage VF (V) | Field current IF (A) | Power loss (W) VS × IF |
| bipolar transfer | 270 | 1.2 | 13.8 | 4.4 | 5.3 |
| Si MOS FET | 350 | 1.5 | 13.5 | 4.3 | 6.5 |
| SiC MOS FET | 14 | 0.07 | 14.93 | 4.8 | 0.34 |

Referring to FIG. 22, reference numeral 10 designates an exciting coil. It is assumed here that the exciting coil 10 has a resistance of 2.9 ohms. Reference numeral 206 designates a switching transistor 206. The ON resistance of the bipolar transistor is 270 mohms, the ON resistance of Si MOS power transistor is 350 mohms, and the ON resistance of SiC MOS power transistor is 14 mohms.

The aforementioned 270 mohms in the Si bipolar transistor is an actually measured value whereas 350 mohms in the Si MOS power transistor and 14 mohms in the SiC MOS power transistor are calculated from ON resistivity values (900 mΩ·mm² in Si, 35 mΩ·mm²) when the withstand voltage shown in FIG. 9 is 300 volts.

It has been made clear from the calculation example that the calculation loss in the SiC switching transistor 206 is only 340 mW, which means that the loss can be remarkably reduced compared with the calculation loss number W of the Si switching transistor 206.

Figure 19:
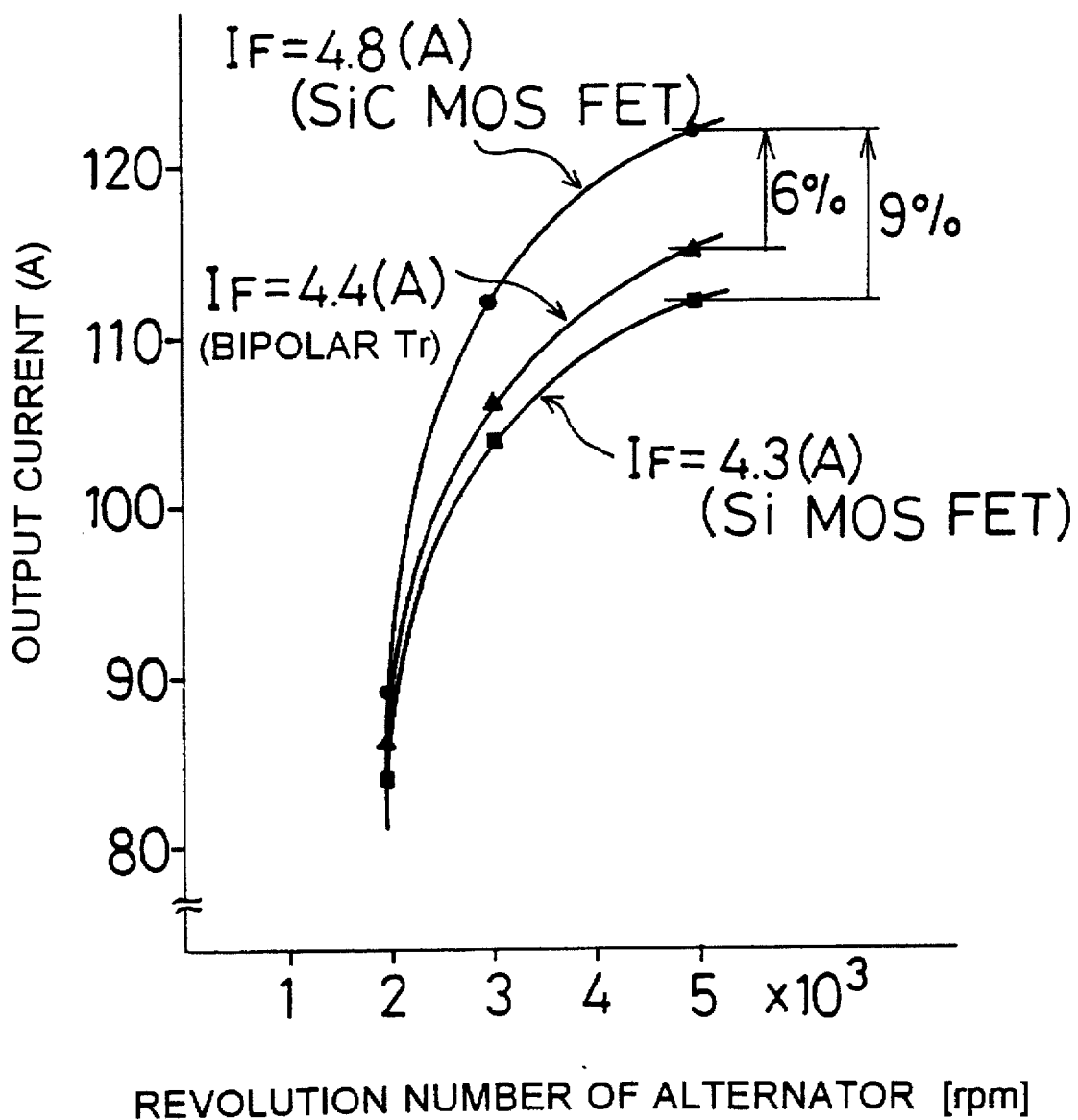
FIG.19 is an actual measurement of properties showing a relation between the revolution number and the output current in the A. C. generator for motor vehicles, the generator incorporating a switching transistor using the SiC-MOST of the present invention and the conventional Si-BPT and Si-MOST.

Next, FIG. 19 shows the result of actual measurement of a relationship between the revolution number and the output current in A. C. generators for motor vehicles using a switching transistor 20b comprising an Si-MOST, an Si-BPT and an SiC-MOST manufactured under the same design rule and with the same chip area.

It has been verified from FIG. 19 that the output current can be increased.

Incidentally, in the aforementioned embodiment, low side MOS power transistors 19d through 19f in the three-phase full wave rectifier 19 and a switching transistor 20b are integrated. The reduction in the heating from the switching transistor 20b enables a monolithic integration of the switching transistor 20b and the controller 20a, or the monolithic integration of MOS power transistors 19d through 19f, the switching transistor 20b and the controller 20a.

In this case, the three-phase full wave rectifier 19 preferably comprises MOS power transistors or MOS-SIT's, the controller 20a is also favorably formed in the same element construction. In such a construction, a connection wiring between the low side MOS power transistors 19d through 19f and the controller 20a can be omitted with the result that electromagnetic radiation noises can also be reduced.

Incidentally, referring to FIG. 18, the P-type well region is formed by ion implantation. However, the P-type well region can be epitaxially grown and formed.

Embodiment 6

Another embodiment of the present invention will be explained in conjunction with FIGS. 20 and 21.

In embodiment 6, a switching transistor 41 for exciting current control constitutes the same hybrid integrated circuit with the other circuit as part of the regulator 20a.

Figure 20:
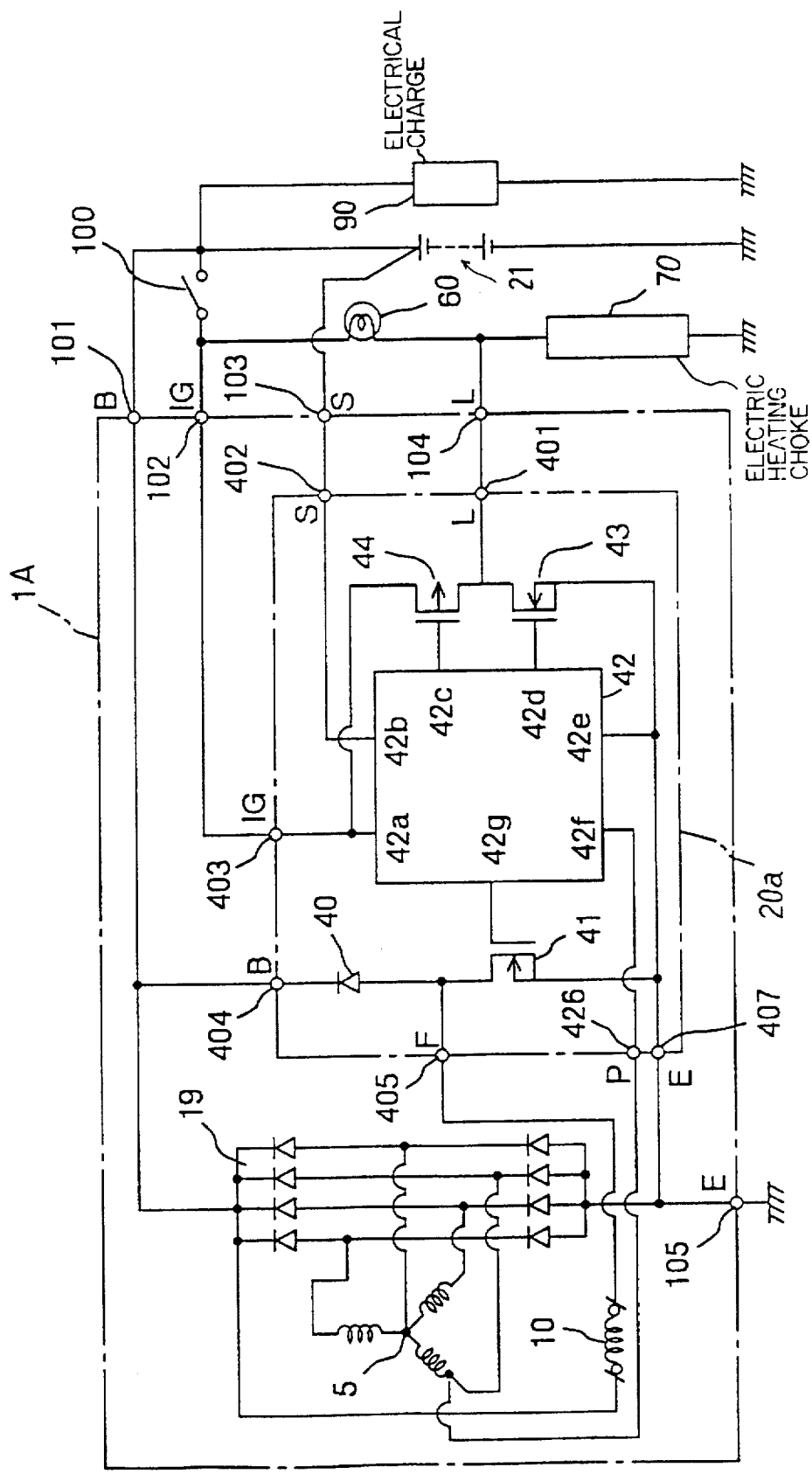
FIG. 20 is a circuit diagram of the A. C. generator for motor vehicles according to a sixth embodiment of the present invention.

The construction of embodiment 6 is explained in conjunction with FIG. 20.

Reference character 1A designates a generator, 101 (B) an output terminal, 102 (IG) an IG terminal, 103 (S) an input terminal of B voltage, 104 (L) a charge lamp driving terminal, and 105 (E) a ground terminal. The generator 1A comprises a generator winding 5, a field winding 10, a voltage regulator (hereinafter referred to as regulator) 20a, and a rectifier 19. The regulator 20a comprises such terminals as a charge lamp driving terminal 401 (L), a battery voltage detecting terminal 402 (S), an IG terminal 403 (IG), a +B terminal 404 (B), a field winding terminal 405 (F), a phase voltage input terminal 406 (P) of the generator winding, and a ground terminal 407 (E), a flywheel diode 40, a switching transistor 41 for exciting current control, the transistor comprising MOSFET using a SiC material, a control IC (hereinafter referred to as MIC) 42, and an electric heating choke driving transistor (SiC MOSFET) 43 of a charge lamp driving transistor (SiC MOSFET) 44. Reference numeral 60 designates a charge lamp, 70 an electric heating choke, 21 a battery, 90 an electrical charge, and 100 an IG switch.

Figure 21:
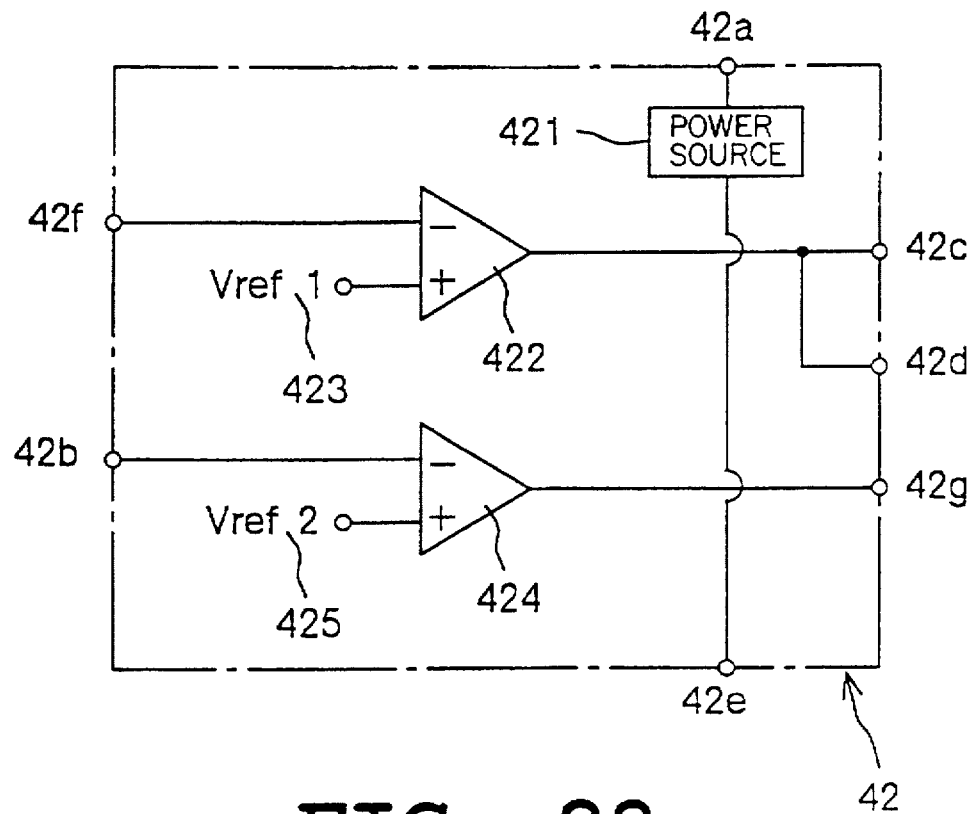
FIG. 21 is an equivalent circuit diagram showing part of the circuit of FIG. 20.

FIG. 21 is a function block diagram of the MIC of FIG. 20.

Reference character 42a designates an IG input terminal, 42b a battery voltage sensing terminal, 42c a transistor driving terminal for driving the electric heating choke, 42d a transistor driving terminal for driving the charge lamp, 42e a ground terminal, 42f a phase voltage input terminal of generator winding, and 42g a driving terminal for driving exciting current control. Reference numeral 421 is a power source for driving MIC (42), 422 is a comparator for detecting power generation wherein the phase voltage of the generator winding is entered from one terminal, and a reference voltage Vref1 (423) that can detect the presence of the start of power generation from the + terminal are entered whereby when the phase voltage is lower than the reference voltage Vref1 (423), a judgment is made to the effect that the power generation is not started which allows the comparator (422) to output a Hi signal to turn off the transistor 44 and turn on the transistor 43 thereby lighting the charge lamp (60). On the other hand, when the phase voltage rises and the start of power generation is confirmed, the comparator (422) outputs Lo to turn off the transistor 43 and to turn on the transistor 44 thereby supplying power to the charge (70).

The comparator 424 controls a transistor for exciting current control. A voltage corresponding to a battery voltage is entered from one terminal whereas a voltage corresponding to a control goal voltage of the battery (Vref2 (425)) is entered from the + terminal. When the battery voltage is higher than a target voltage, the output of the comparator becomes Lo and the transistor 411 for exciting current is turned off. On the other hand, when the battery voltage is low, the output of the comparator 422 becomes Hi and the transistor 41 for exciting current is turned on.

In the foregoing passage, an advantage of the present invention is described.

A first merit of a lower ON resistance is that a voltage drop of the element 41 can be reduced with the result that an efficiency is improved as a result of reduced power loss and the radiating fan can be reduced in size because heating can be suppressed. A second merit is that a voltage is applied to a field winding 10 because the voltage drop can be reduced with the result that the exciting current increases and the output can be increased. The result of the verification of the aforementioned facts is shown in Table 1 described in embodiment 5.

Namely, further referring to Table 1, the field winding 10 and the switching element 41 are connected in series as shown in FIG. 22. A voltage applied across the field winding 10 and the switching element 41 is set to 14 volts. The field winding 10 has a resistance of 2.9 ohms, An ON resistance of the element is set with currently used element with a withstand voltage of 300 volts as a reference. The ON resistance of bipolar transistors is 270 mohms (an actual measurement of forward voltage drop is 1.2 volts), and the ON resistance of SiC-MOSFET is 350 mohms (an actual measurement of forward voltage drop is 1.5 volts). Referring to the SiC-MOSFET, the ON resistance of SiC-MOSFET is calculated at 14 mohms because the ON resistance of SiC-MOSFET can be reduced to about 1/25 that of Si-MOSFET at a withstand voltage of 300 volts from a relation of the ON resistance with respect to the withstand voltage of Si and SiC. As a consequence, the ON resistance, voltage drop ($V_S$) voltage ($V_F$) applied to the field winding, exciting current ($I_F$), and element loss (W) can be given as shown in Table 1. It has been made clear that the exciting current of the SiC-MOSFET in the embodiment is improved by 9% compared with bipolar transistors, and by 12% compared with Si-MOSFET. It has been also made clear that the power loss of the SiC-MOSFET is reduced to 1/16 that of bipolar transistors and 1/19 that of Si MOSFET. The output increase expected as a result of an increase in the exciting current is shown in FIG. 19. FIG. 19 shows that the output of the SiC-MOSFET can be increased by about 6% compared with bipolar transistors and by about 9% compared with Si-MOSFET.

Embodiment 7

Figure 23:
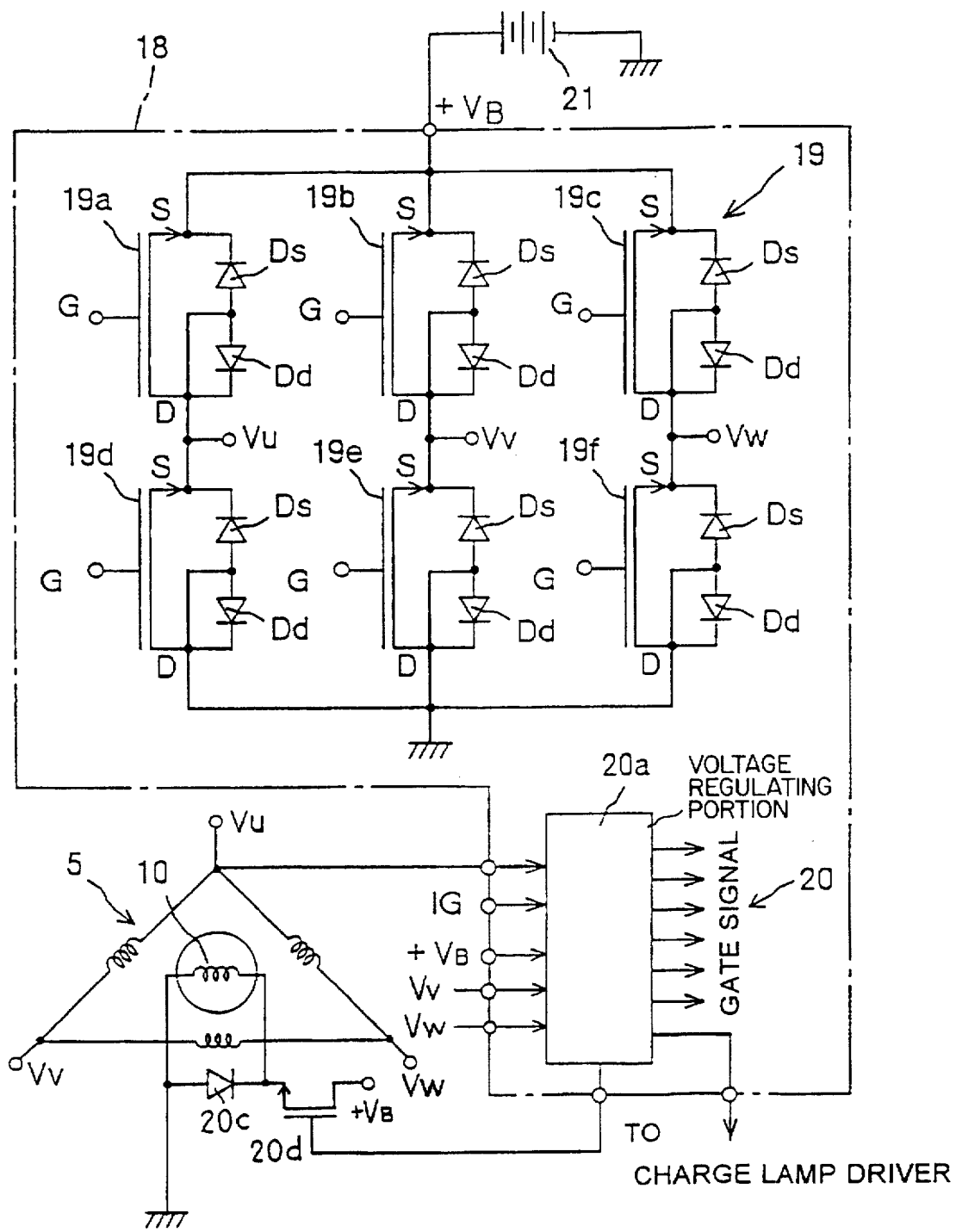
FIG. 23 is a circuit diagram of the A. C. generator for motor vehicles according to a seventh embodiment of the present invention.
Figure 24:
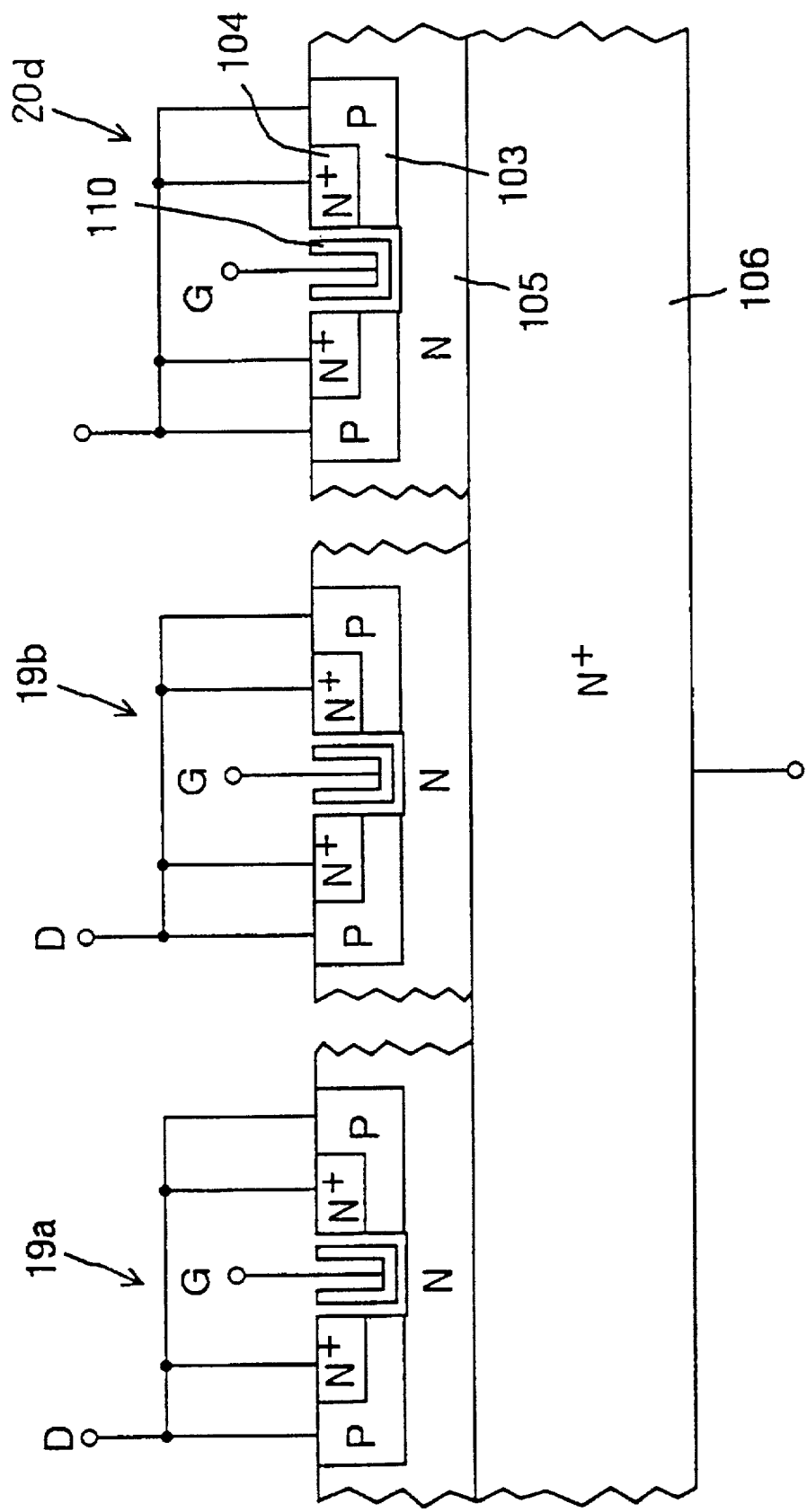
FIG. 24 is a sectional view of the high side MOS power transistors and the switching transistor 20d in the three-phase full wave rectifier of FIG. 23.

FIGS. 23 and 24 show embodiment 7 of the present invention. In embodiment 7, high side MOS power transistors 19a through 19c, and exciting switching transistor 20d are integrated on the same chip. In this case, the switching transistor 20d is connected to the high potential side of the battery.

Embodiment 8

Figure 25:
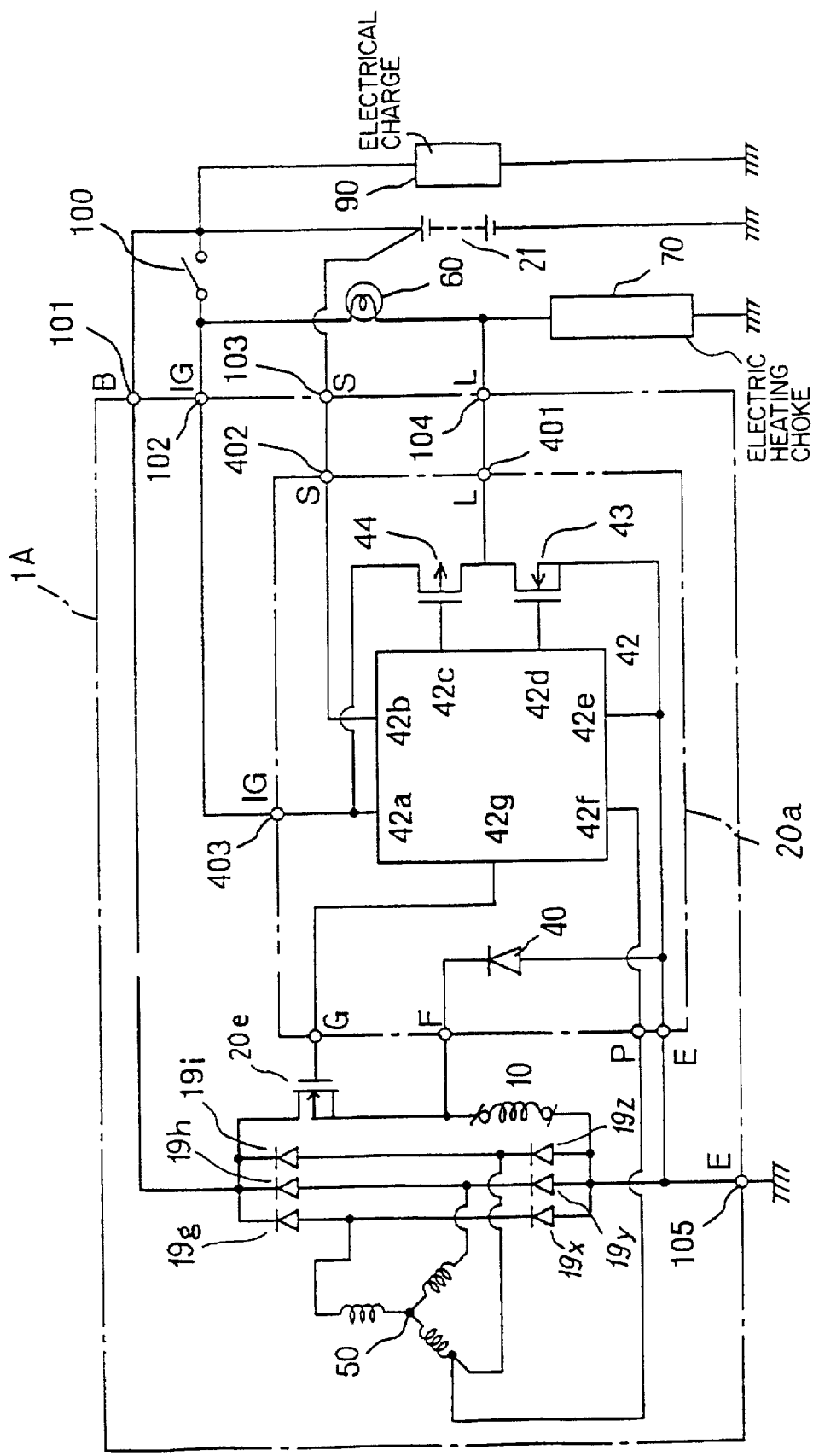
FIG. 25 is circuit diagram of the A. C. generator for motor vehicles according to an eighth embodiment of the present invention.
Figure 26:
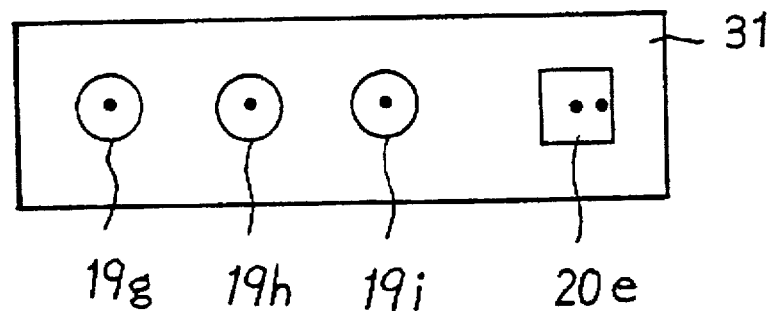
FIG. 26 is a view showing a state in which the full wave rectifier and an exciting switching transistor 20e are provided on the same radiating fin 31.

FIGS. 25 and 26 shows embodiment 8 of the present invention. In embodiment 8, an exciting switching transistor 20e is formed as a separate entity from a voltage regulator 20a. In addition, the switching transistor 20e is provided on the same radiating fin 31 as the full wave rectifiers 19g through 19i and 19x through 19z as shown in FIG. 26. In this manner, a high heat resistance properties of SiC can be drawn out more when a switching transistor for exciting current control which constitutes a heating portion is separated from a voltage regulation portion in thermal construction. In addition, since the switching transistor is formed of SiC, the switching transistor can be operated at high temperatures. The switching transistor can be improved in cooling efficiency by sharing a radiating fin with the full wave rectifier who can have a high temperature on the order of, for example, 170° to 200° C. Since the voltage regulator except for the transistor constituting a heating portion does not have a high temperature, cooling wind can be directed to a generator winding or the like, which has further improved the efficiency of the generator.

Besides, when only the SiC-made exciting switching transistor which is capable of operating at high temperatures is incorporated in generators and a control circuit for a switching transistor using a conventional Si-IC which is not suitable for a high temperature operation is arranged outside of the generator, the cooling performance of the generator is improved and the reliability thereof is also improved.

Embodiment 9

Figure 28:
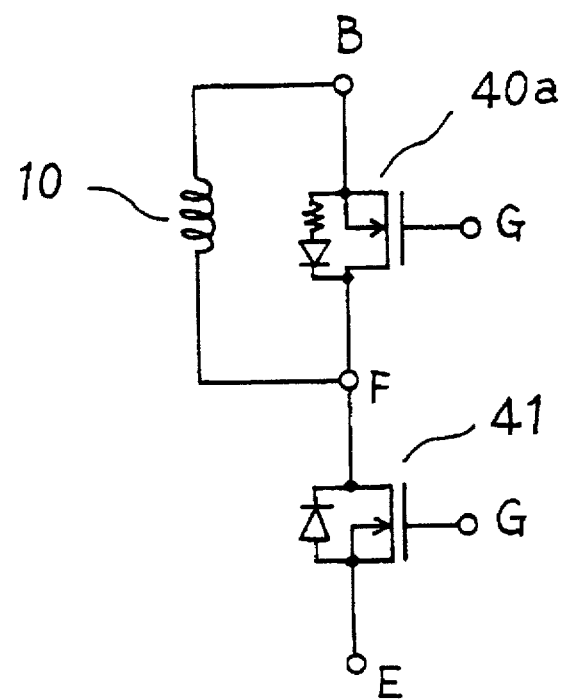
FIG. 28 is an equivalent circuit diagram showing a circuit of FIG. 27.
Figure 27:
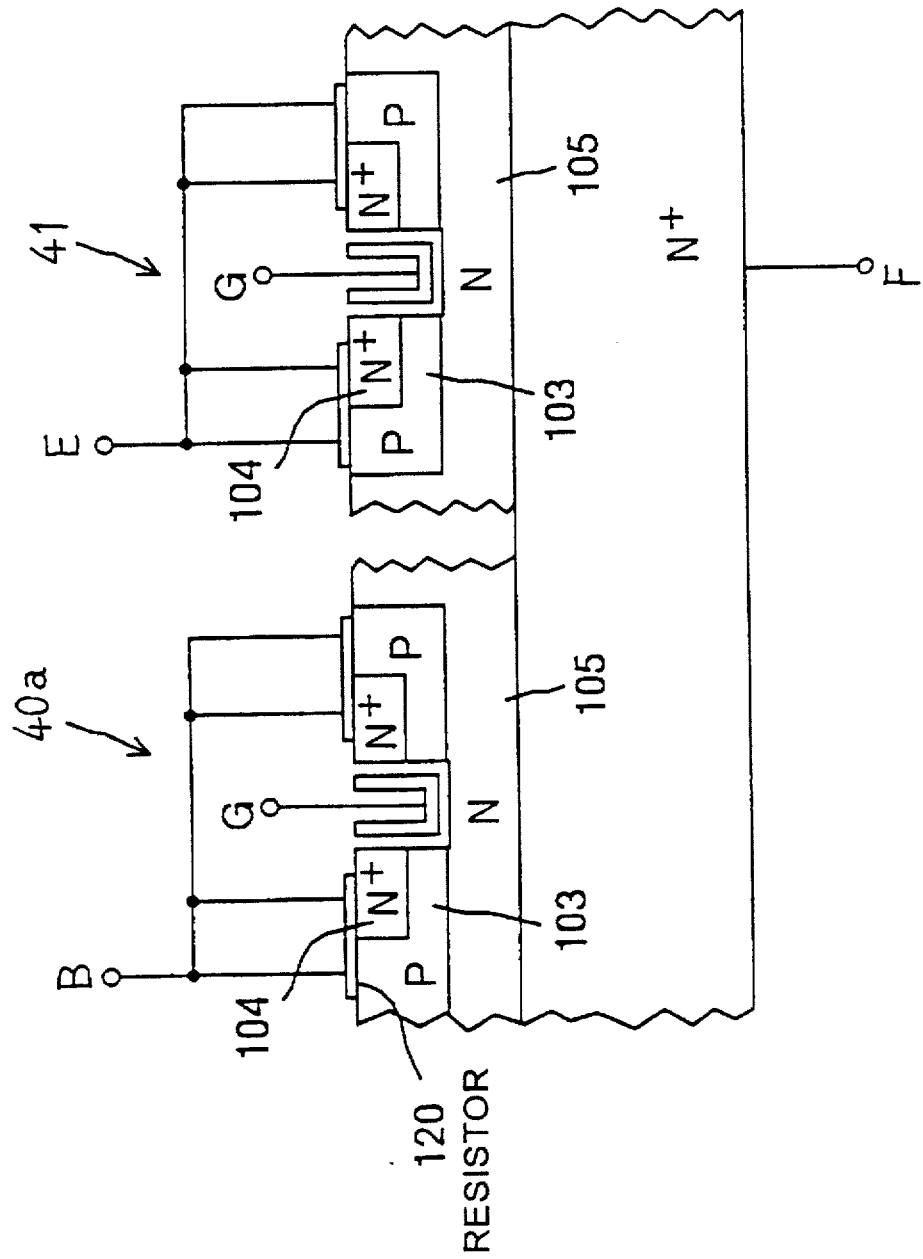
FIG. 27 is a sectional view in which a flywheel diode 40a and an exciting switching transistor 41 are formed on the same chip.

FIGS. 27 and 28 show embodiment 9 of the present invention. In embodiment 9, a flywheel diode 40a is constituted of a MOS power transistor, and a transistor 41 for an exciting current control is formed of the SiC-made chip.

The flywheel diode constituted of this MOS transistor is operated by controlling the gate G voltage of the transistor so that a circulating current flows through a field coil 10. Constituting the diode with the same chip improves the assemblage work efficiency, and use of MOS transistors using SiC material with a low ON resistance in place of a flywheel reduced a loss of circulating current.

The present invention thus being described, it is to be understood that the invention is not limited by any of the details of description, unless otherwise specified, but rather be constructed broadly within its spirit and scope as set out in the accompanying claims.

What is claimed is:

1. An engine-driven alternating current generator for a motor vehicle comprising:

an armature coil wound around an iron core of said generator for generating an alternating current generated voltage, said armature coil having an output terminal;

a battery for supplying power to an electrical system of said motor vehicle, said battery having a high potential terminal and a low potential terminal;

a power converter having at least one of high side semiconductor power elements and low side semiconductor power elements, said high side semiconductor power elements connecting said output terminal of said armature coil to said high potential terminal of said battery, said low side semiconductor power elements connecting said output terminal of said armature coil to said low potential terminal of said battery, said power converter converting said alternating current generated voltage into a direct current voltage for supplying to said battery;

a field coil for generating a magnetic flux to said armature coil; and an exciting current controller having a switching transistor for controlling an exciting current to said field coil;

at least one of said high side and low side semiconductor power elements in said power converter and said switching transistor in said exciting current controller including a MOS transistor structure;

said MOS transistor structure including a withstand voltage layer; and a material of said MOS transistor structure being a compound of Si and C (SIC) such that said withstand voltage layer has a resistivity smaller than that of a MOS transistor structure which is formed of only Si, while ensuring a same withstand voltage.

2. An alternating current generator for a motor vehicle according to claim 1, wherein:

said withstand voltage layer of said MOS transistor structure of SiC has a withstand voltage of at least 100V between a source and a drain of said MOS transistor structure.

3. An alternating current generator for a motor vehicle according to claim 1, wherein:

said generator includes a three-phase armature coil having three output terminals;

said power converter has at least one of high side MOS power transistors as said semiconductor power elements of SiC and low side MOS power transistors as said semiconductor power elements of SiC;

said high side MOS power transistors being connected in parallel between said three output terminals of said three-phase armature coil and said high potential terminal of said battery, respectively; and said low side MOS power transistors being connected in parallel between said three output terminals of said three-phase armature coil and said low potential terminal of said battery, respectively.

4. An alternating current generator for a motor vehicle according to claim 1, wherein:

said high side semiconductor power elements and said low side semiconductor power elements are all MOS power transistors;

said power converter includes both said high side semiconductor power elements and said low side semiconductor power elements; and at least one of said high side semiconductor power elements and said low side semiconductor power elements are formed of SiC.

5. An alternating current generator for a motor vehicle according to claim 1, wherein:

said power converter includes both said high side semiconductor power elements and said low side semiconductor power elements; and one of said high side semiconductor power elements and said low side semiconductor power elements being MOS power transistors of SiC and the other being PN-junction diodes.

6. An alternating current generator for motor vehicles according to any one of claims 3 through 5, wherein said MOS power transistor includes:

an N$^+$-type SiC substrate acting as a source electrode where a current flowing through said MOS power transistor flows out;

an N-type withstand voltage layer disposed on said substrate as said withstand voltage layer;

a P-type well region disposed on a surface portion of said N-type withstand voltage layer;

an N$^+$-type drain region disposed on a surface portion of said P-type well region acting as a drain electrode where said current flowing through said MOS power transistor flows thereinto; and a gate electrode disposed on a surface portion of said P-type well region between said N$^+$-type drain region and said N-type withstand voltage layer with an insulating film interposed therebetween;

said gate electrode forming an N-channel at said surface portion of said P-type well region between said N$^+$-type drain region and said N-type withstand voltage layer; and said N⁺-type drain region and said P-type well region being electrically short-circuited.

7. An alternating current generator for a motor vehicle according to claim 6, wherein:

said generator includes a three-phase armature coil having three output terminals;

said high side semiconductor power elements are said MOS power transistors;

said MOS power transistors are integrated on a single chip such that said substrate is provided for a common source of said MOS power transistors;

each phase P-type well region of said MOS power transistors is individually formed on said substrate;

each phase N⁺-type drain region of said MOS power transistors is individually formed on said surface portion of each P-type well region; and each phase gate electrode is individually arranged on a surface portion of each P-type well region for forming a channel that allows each drain region and said withstand voltage layer to conduct electricity.

8. An alternating current generator for a motor vehicle according to any one of claims 3 through 5, wherein:

said power converter is mounted on a common substrate with a voltage regulating circuit for controlling switching of said MOS power transistors in said power converter.

9. An alternating current generator for a motor vehicle according to any one of claims 1 through 5, wherein:

said power converter acts as one of a full wave rectifier and a half wave rectifier.

10. An alternating current generator for motor vehicles according to any one of claims 3 through 5, wherein said switching transistor in said exciting current controller comprises:

a MOS power transistor;

said MOS power transistors in said power converter and said switching transistor in said exciting current controller being formed of a single crystal SiC material.

11. An alternating current generator for a motor vehicle according to claim 10, wherein:

said switching transistor in said exciting current controller is integrated on a common SiC chip with one of said high side and low side MOS power transistors in said power converter.

12. An alternating current generator for a motor vehicle according to any one of claims 3 through 5, wherein:

said power converter including said MOS power transistors is disposed on a housing of said generator.

13. An alternating current generator for a motor vehicle according to any one of claims 1 through 5, wherein:

said switching transistor in said exciting current controller is disposed separate from a control circuit portion of said exciting current controller.

14. An alternating current generator for a motor vehicle according to claim 10, wherein:

said switching transistor in said exciting current controller is disposed on a same radiating fin as said semiconductor power elements in said power converter.

15. An alternating current generator for a motor vehicle according to any one of claims 1 through 5, wherein:

said semiconductor power elements in said power converter and said switching transistor in said exciting current controller are disposed on a housing of said generator.

16. An alternating current generator for a motor vehicle according to claim 13, wherein:

said control circuit portion of said exciting current controller is disposed outside of said generator to control said switching transistor disposed inside said generator.

17. An alternating current generator for a motor vehicle according to any one of claims 1 through 5, wherein:

said power converter and said exciting current controller are housed in a same case and are disposed on a housing of said generator.

18. An alternating current generator for a motor vehicle according to any one of claims 1 through 5, wherein:

an MOS transistor causing a circulating current to flow through said field coil is connected in parallel with said field coil; and said MOS transistor is integrated on a same SiC material chip as said switching transistor in said exciting current controller.

19. An alternating current generator for a motor vehicle according to any one of claims 1 through 5, wherein:

said MOS transistor structure has a vertical type structure having a source and a drain thereof vertically arranged with said withstand voltage layer interposed therebetween, and has a trench gate structure which includes a trench, a gate insulation film of a thermal oxide film formed at least on a sidewall of said trench, and a gate electrode buried in said trench.

20. An alternating current generator for a motor vehicle according to any one of claims 1 through 5, wherein:

said withstand voltage layer of said MOS transistor structure has a thickness of approximately 4 μm with a breakdown voltage of approximately 300V.

21. An alternating current generator for a motor vehicle according to any one of claims 1 to 5, wherein:

said withstand voltage layer of said MOS transistor structure has a thickness T which is set by a following equation:

$$T = 4(\mu m)/300(V) \times BV$$

wherein BV is a required breakdown voltage.

* * * * *